(12) United States Patent
Owa et al.

(10) Patent No.: US 10,768,341 B2
(45) Date of Patent: Sep. 8, 2020

(54) OPTICAL MATERIAL, OPTICAL ELEMENT AND METHOD FOR MANUFACTURING SAME

(71) Applicant: NIKON CORPORATION, Tokyo (JP)

(72) Inventors: Soichi Owa, Kumagaya (JP); Shunji Watanabe, Tokyo (JP); Junji Suzuki, Tama (JP); Kazuhiro Kido, Sagamihara (JP); Hidemitsu Toba, Tokyo (JP)

(73) Assignee: NIKON CORPORATION, Tokyo (JP)

( * ) Notice: Subject to any disclaimer, the term of this patent is extended or adjusted under 35 U.S.C. 154(b) by 174 days.

(21) Appl. No.: 16/001,235

(22) Filed: Jun. 6, 2018

(65) Prior Publication Data

US 2018/0284324 A1 Oct. 4, 2018

Related U.S. Application Data

(60) Continuation of application No. 15/068,030, filed on Mar. 11, 2016, now Pat. No. 10,012,768, which is a division of application No. 13/248,331, filed on Sep. 29, 2011, now Pat. No. 9,310,520, which is a continuation of application No. PCT/JP2010/056403, filed on Apr. 8, 2010.

(Continued)

(30) Foreign Application Priority Data

| Oct. 22, 2009 | (JP) | 2009-243438 |
| Oct. 22, 2009 | (JP) | 2009-243439 |

(51) Int. Cl.
*B32B 3/10* (2006.01)
*G02B 1/00* (2006.01)
(Continued)

(52) U.S. Cl.
CPC .............. *G02B 1/007* (2013.01); *B82Y 20/00* (2013.01); *G02B 1/14* (2015.01); *G03F 7/20* (2013.01);
(Continued)

(58) Field of Classification Search
None
See application file for complete search history.

(56) References Cited

U.S. PATENT DOCUMENTS 8,130,171 B2    3/2012  Lam et al.
8,648,306 B1*   2/2014  Goertz .............. H01Q 15/0086
                                                250/340
(Continued)

FOREIGN PATENT DOCUMENTS

EP     1 420 298 A2    5/2004
WO  2010/026908 A1    3/2010

OTHER PUBLICATIONS

Ishikawa et al., "Negative Magnetice Permeability in the Visible Light Region," Physical Reveiw Letters, 2005, vol. 95, pp. 237401-1-237401-4.

(Continued)

*Primary Examiner* — Christopher M Polley
(74) *Attorney, Agent, or Firm* — Oliff PLC

(57) ABSTRACT

An optical member to be arranged in an optical path of a light, includes an optical medium made of an insulator or a semiconductor; a first element provided at a first position in the optical medium and made of a first electric conductor having a width approximately same as or smaller than a wavelength of the light, the first position being a position in the optical path; and a second element provided at a second position, in the optical medium, different from the first position, and made of a second electric conductor having a width approximately same as or smaller than the wavelength of the light, the second position being a position in the optical path.

17 Claims, 18 Drawing Sheets

Related U.S. Application Data

(60) Provisional application No. 61/202,845, filed on Apr. 10, 2009.

(51) Int. Cl.
  B82Y 20/00 (2011.01)
  G02B 1/14 (2015.01)
  G03F 7/20 (2006.01)
  G03F 7/32 (2006.01)

(52) U.S. Cl.
  CPC ......... *G03F 7/32* (2013.01); *Y10T 428/24893* (2015.01)

(56) References Cited

U.S. PATENT DOCUMENTS

| | | |
|---|---|---|
| 2007/0242247 A1 | 10/2007 | Shiraishi |
| 2011/0139488 A1 | 6/2011 | Toujo |

OTHER PUBLICATIONS

Smith et al., "Composite Medium with Simultaneously Negative Permeability and Permittivity," Physical Review Letters, 2000, vol. 84, No. 18, pp. 4184-4187.

Ishikawa et al., "Frequency dependence of the magnetic response of split-ring resonators," J. Opt. Soc. Am. B, 2007, vol. 24, No. 3, pp. 510-515.

Jun. 8, 2010 International Search Report issued in International Application No. PCT/JP2010/056403.

Jun. 8, 2010 Written Opinion of International Searching Authority issued in International Application No. PCT/2010/056403.

Mar. 13, 2015 Office Action issued in U.S. Appl. No. 13/248,331.

Nov. 30, 2015 Notice of Allowance issued in U.S. Appl. No. 13/248,331.

Mar. 5, 2018 Notice of Allowance issued in U.S. Appl. No. 15/068,030.

* cited by examiner

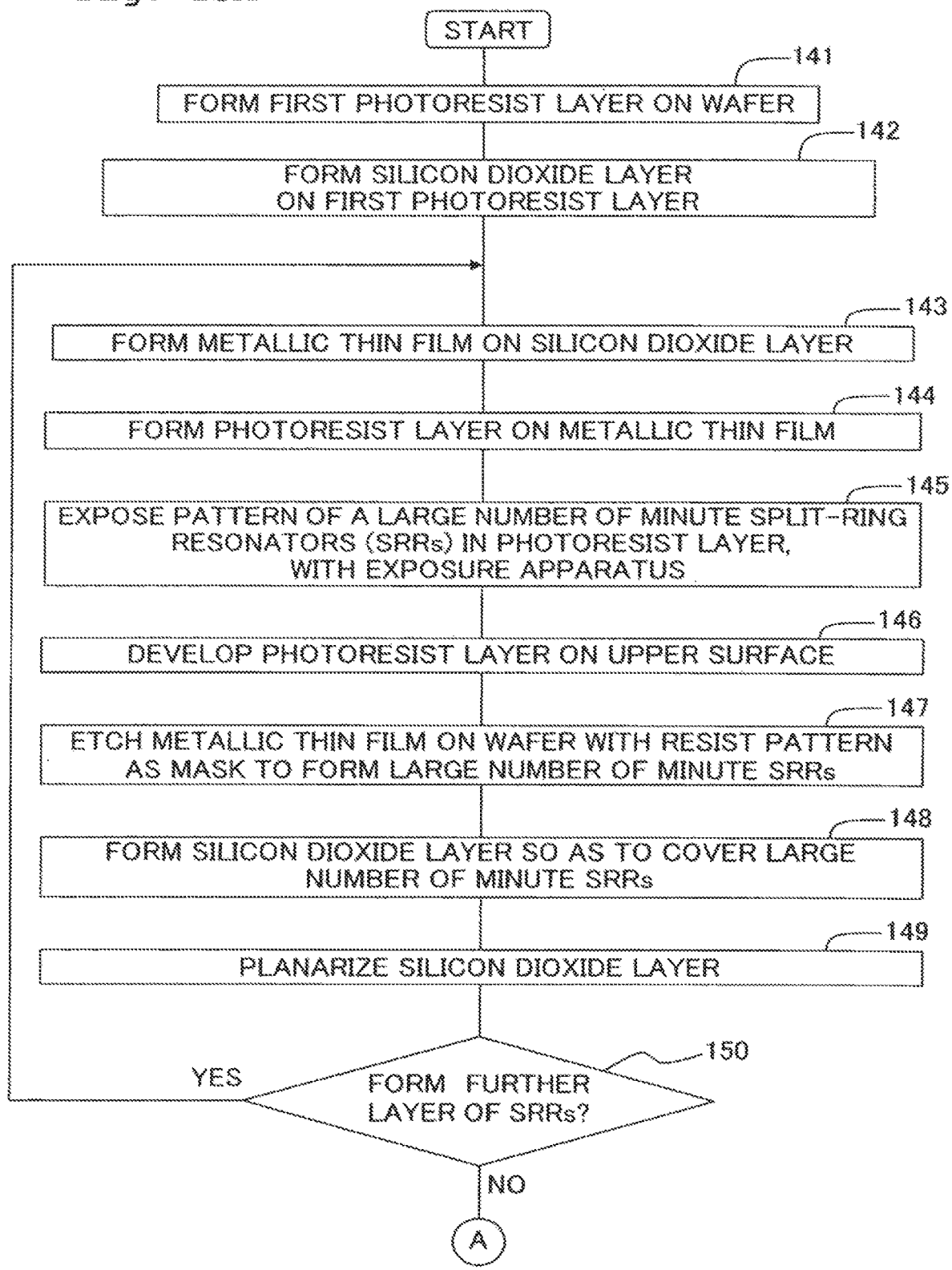

OPTICAL MATERIAL, OPTICAL ELEMENT AND METHOD FOR MANUFACTURING SAME

This is a continuation of U.S. application Ser. No. 15/068,030 filed on Mar. 11, 2016, which is a Divisional of U.S. application Ser. No. 13/248,331 filed on Sep. 29, 2011 (now U.S. Pat. No. 9,310,520), which is a Continuation of International Application No. PCT/JP2010/056403 filed on Apr. 8, 2010 claiming the conventional priority of U.S. Provisional Application No. 61/202,845 filed on Apr. 10, 2009, Japanese Patent Application No. 2009-243438 filed on Oct. 22, 2009 and Japanese Patent Application No. 2009-243439 filed on Oct. 22, 2009, all of the disclosures of which are incorporated herein by reference in their entirety.

TECHNICAL FIELD

The present teaching relates to an optical material which is used as a component (a part or a portion) of a liquid or solid to which an illumination light (illumination light beam) is irradiated, an optical liquid and an optical element which include the optical material, a method for producing the optical material and a method for producing the optical liquid and the optical element. More specifically, the present teaching relates to, for example, an optical material having relative permeability which is different from 1 (one).

BACKGROUND ART

Optical materials such as conventional optical glass all have a relative permeability that is approximately 1 and have a relative permittivity that is greater than 1, and thus have refractive index with a positive value greater than 1. In view of this situation, researches are made with respect to so-called meta-materials that are substances provided with a structure smaller than the wavelength of a light as an objective to which the meta-materials are to be applied and greater than an atom or molecule and exhibiting a relative permeability value and/or relative permittivity value which are/is unobtainable with a substance in the natural world. Further, with respect for example to a microwave having a wavelength of 6 cm (frequency: 5 GHz), a large number of small split-ring resonators having a negative relative permeability and a large number of thin metallic lines having a negative relative permittivity and arranged in parallel are combined and thus a substance (structure) having a negative refractive index is realized (see, for example, Non-patent Literature 1).

In the recent years, in order to realize a substance having a negative refractive index to lights in the infrared to visible regions, for example, such a substance is theoretically proposed having a plurality of minute split-ring resonators and a relative permeability that is greatly different from 1 (including a negative value) with respect to a light of which wavelength is about 1,000 nm to about 400 nm (see, for example, Non-patent Literature 2). By combining the minute split-ring resonators (having the relative permeability in a negative range) and another substance having a negative relative permittivity, it is possible to realize the substance having the negative refractive index to the lights in the infrared to visible regions.

CITATION LIST

Non-Patent Literature

[Non-Patent Literature 1]
D. R. Smith et al.: "Composite medium with simultaneously negative permeability and permittivity", Phys. Rev. Lett. (the United States), 84, pp. 4184-4187 (2000).

[Non-Patent Literature 2]
A. Ishikawa, T. Tanaka and S. Kawata: "Frequency dependence of the magnetic response of split-ring resonators", J. Opt. Soc. Am. B (the United States), Vol. 24, No. 3, pp. 510-515 (2007).

SUMMARY

According to a first aspect of the present teaching, there is provided an optical material which is used as a component of a liquid or solid to which an illumination light is irradiated, the optical material comprising:
a plurality of minute resonators each of which is formed of a conductor having a width approximately same as or smaller than a wavelength of the illumination light; and
a protective film which is formed of an insulator or a semi-conductor, wherein each of the minute resonators is covered by the protective film.

According to a second aspect of the present teaching, there is provided an optical material which is used as a component of a liquid or solid to which an illumination light is irradiated, the optical material comprising a plurality of resonating elements each of which includes:
a plurality of minute resonators each of which is formed of a conductor having a width approximately same as or smaller than a wavelength of the illumination light and which are arranged apart from each other; and
a protective film which is formed of an insulator or a semi-conductor and which covers the minute resonators.

According to a third aspect of the present teaching, there is provided an optical liquid comprising a liquid; and the optical material of the first or second aspect of the present teaching which is mixed in the liquid.

Further, according to a fourth aspect of the present teaching, there is provided an optical element comprising the optical material of the first or second aspect of the present teaching which is solidified.

Furthermore, according to a fifth aspect of the present teaching, there is provided a method for producing an optical material composed of a plurality of minute resonators each of which is formed of a conductor, and is covered by a protective film formed of an insulator or a semi-conductor, the method comprising the steps of:
forming a sacrifice layer on a substrate;
forming a first protective layer formed of the insulator or the semi-conductor on the sacrifice layer;
forming a conductive layer formed of the conductor on the first protective layer;
patterning the minute resonators in the conductive layer;
forming a second protective layer formed of the insulator or the semi-conductor so as to cover the patterned minute resonators; and
removing the sacrifice layer.

According to a sixth aspect of the present teaching, there is provided a method for producing an optical material having a plurality of optical elements each of which is composed of a plurality of minute resonators formed of a conductor and is arranged apart from each other, and which are covered by a protective film formed of an insulator or a semi-conductor, the method comprising the steps of:
forming a sacrifice layer on a substrate;
forming a first protective layer formed of the insulator or the semi-conductor on the sacrifice layer;
forming a first conductive layer formed of the conductor on the first protective layer;
patterning the minute resonators in the first conductive layer;

forming a second protective layer formed of the insulator or the semi-conductor so as to cover the patterned minute resonators;

removing a part of the first protective layer and a part of the second protective layer based on an arrangement of the minute resonators in each of the optical elements; and removing the sacrifice layer.

DESCRIPTION OF THE EMBODIMENTS

[First Embodiment]

A preferred first embodiment of the present teaching will be explained with reference to FIGS. 1 to 6.

Figure 1A:
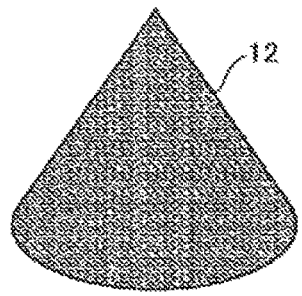
FIG. 1(A) is a perspective view of powder of an optical material of a first embodiment.
Figure 1B:
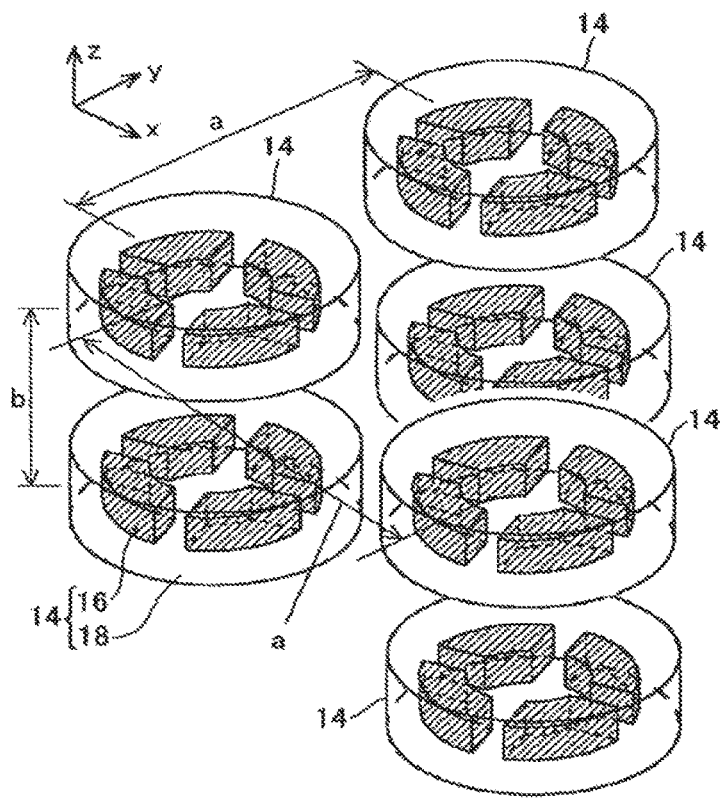
FIG. 1(B) is an enlarged perspective view of a plurality of resonating elements 14 (each of which is a split-ring resonator (SRR) covered by a protective layer) constructing the powder.

FIG. 1(A) shows powder 12 of an optical material of the embodiment, FIG. 1(B) is an enlarged perspective view of a plurality of resonating elements 14 which are a part or portion composing the powder 12 and each of which is a split-ring resonator covered by a protective layer. In the following description, the split-ring resonator is also referred to as "SRR". In FIG. 1(B), each of the plurality of resonating elements 14 is formed or constructed, for example, by covering entire faces of a split ring-shaped SRR (split-ring resonator) 16, which is made of a metal such as silver (Ag), gold (Au), copper (Cu), aluminum (Al) or the like, with a protective layer 18 having a disc-shape and formed of an insulator (insulating material) such as silicon dioxide ($SiO_2$), aluminum oxide ($Al_2O_3$), or the like. Note that the protective layer 18 may have, for example, a square plate-shape.

In FIG. 1(B), two resonating elements 14 adjacent in the x-direction and the y-direction are periodically arranged with a period of "a" and two resonating elements 14 adjacent in the z direction are periodically arranged with a period of "b" in the rectangular coordinate system (x, y, z). Note that the arrangement state of the plurality of resonating elements 14 in FIG. 1(B) is a virtual arrangement for calculating the relative permeability (to be discussed later), and a large number of the resonating elements 14 in the powder 12 shown in FIG. 1(A) are randomly arranged. In this embodiment, since each of the SRRs 16 is covered by the protective layer 18, average spacing distances or gaps (arrangement periods) of the plurality of SRRs 16 in the lateral and thickness directions thereof respectively are substantially defined by an outer shape of the protective layer 18.

Figure 1C:
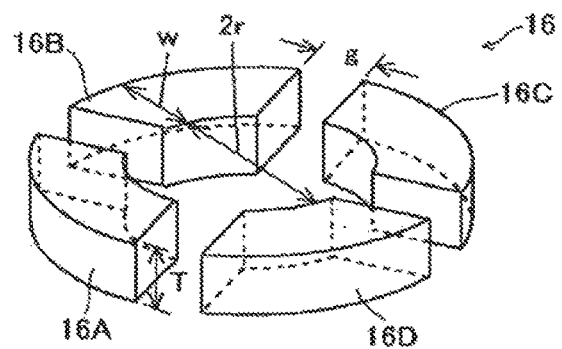
FIG. 1(C) is an enlarged perspective view showing one SRR.

FIG. 1(C) shows one of the SRRs (split-ring resonators) 16 in one resonating element 14 as shown in FIG. 1(B). In FIG. 1(C), the SRR 16 is constructed of four fan-shaped members 16A, 16B, 16C and 16D obtained by splitting or dividing a ring, of which center is an axis parallel to the z axis, in the circumference direction of the circle with a spacing distance g. Note that a split number N (N=2, 3, 4, 5, . . . ) by which the SRR is split is arbitrary, and the SRR 16 may be constructed of a plurality of arbitrary number of fan-shaped members.

The inner diameter of the SRR 16 is r (diameter is $2r$), the width in the radial direction of the SRR 16 is w, the thickness of the SRR 16 is T. In this case, according to the document by A. Ishikawa, T. Tanaka and S. Kawata and entitled "Frequency dependence of the magnetic response of split-ring resonators", J. Opt. Soc. Am. B (the United States), Vol. 24, No. 3, pp. 510-515 (2007) (hereinafter referred to as "Reference Literature A"), an effective relative permeability μeff of the plurality of SRRs 16 arranged as shown in FIG. 1(B) with respect to an illumination light having a predetermined wavelength λ (angular frequency is ω) is as follows. The real part of the relative permeability is μRe, the imaginary part of the relative permeability is μIm, and i is the imaginary unit.

$$\mu_{eff} = \mu_{Re} + i\mu_{Im} = 1 - \frac{F\omega^2}{\omega^2 - \frac{1}{CL} + i\frac{Z(\omega)\omega}{L}}, \quad (1)$$

Further, provided that the space permeability (vacuum permeability) is $\mu_0$, the permittivity is $\varepsilon_0$, and the relative permittivity of the SRR 16 is εr, then the parameters F, C, L and the impedance Z (ω) in the formula (1) are represented as follows:

$$F = \frac{\pi r^2}{a^2}, \quad (2)$$

$$C = \frac{1}{N}\epsilon_0\epsilon_r\frac{wT}{g}, \quad (3)$$

$$t = \frac{g}{2w+g}, \quad (4)$$

$$L = \frac{\mu_0\pi r^2}{b}, \quad (5)$$

$$Z(\omega) = \frac{2\pi r Z_s(\omega)}{w}, \quad (6)$$

$$Z_s(\omega) = R_s(\omega) + iX_s(\omega) \quad (7)$$

Note that in this embodiment, the parameter t in the formula (4) is not used. Further, the split number N in the formula (3) is 4 regarding the SRR 16; Rs(ω) in the formula (7) is the surface resistance of the SRR 16 and Xs(ω)in the formula (7) is the inner reactance of the SRR 16; and as disclosed in Reference Literature A, in a case that, for example, the wavelength λ is in the visible region, the Rs(ω) takes a value in a range from about 0.2 to about 1.7 depending on the material of the SRR 16, and the Xs(ω) takes a large negative value regardless of the material.

Figure 2:
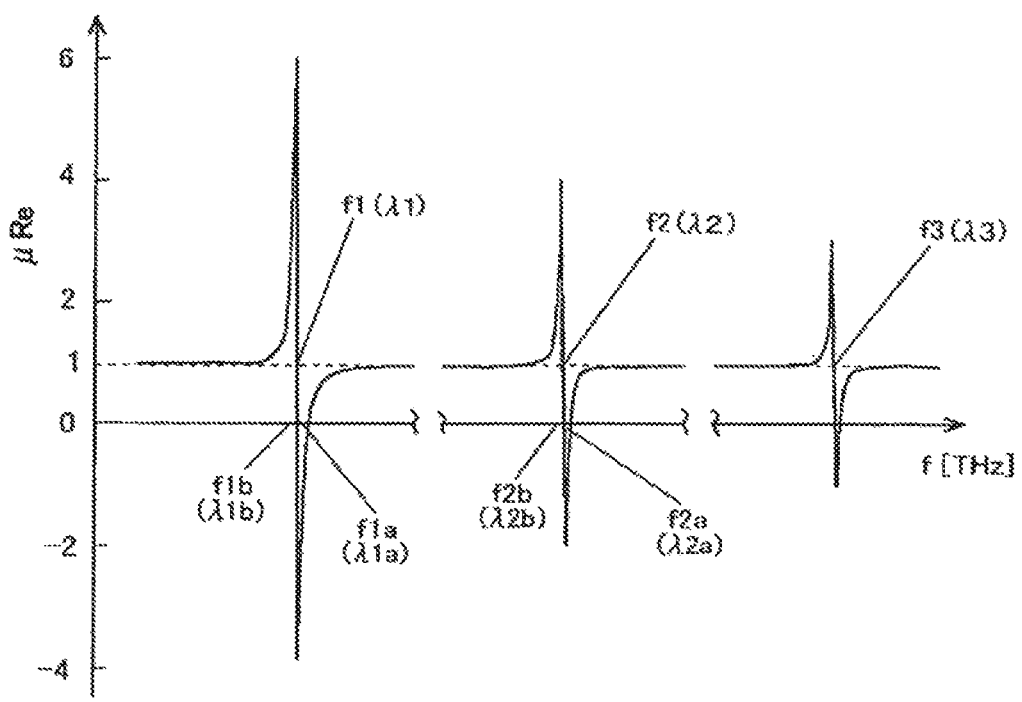
FIG. 2 is a diagram showing an example of relative permeability of the SRR.

Further, according to the formula (1), the real part μRe of the effective relative permeability μeff becomes considerably greater than 1 in predetermined ranges in each of which a frequency f [THz] of the illumination light is smaller than a predetermined resonance frequency (f1, f2, f3, etc.) and takes a negative value in predetermined ranges in each of which the frequency f is greater than the predetermined resonance frequency, as shown in FIG. 2, depending on the shape and arrangement of the SRRs 16. Furthermore, as the resonance frequency f becomes higher from f1 to f3, the absolute value of the real part μRe becomes smaller. Note that the resonance frequency is substantially defined by the parameters of the shape of SRR 16 (r, w, T, etc.), and the contribution by the arrangement periods a, b of the SRRs 16 are considered as relatively small.

According to Reference Literature A, in a case that the radius r of the SRR 16 is same as the width w of the SRR 16, that the period b is 350 nm, the spacing distance g is 33 nm, the thickness T is 2.5 times the penetration depth, and the relative permittivity εr is 2.25, the resonance frequency f1 is 300 THz (the wavelength λ1 corresponding thereto is 1000 nm (1 μm)), the resonance frequency f2 is 500 THz (the wavelength λ2 corresponding thereto is 600 nm), and the resonance frequency f3 is 700 THz (the wavelength λ3 corresponding thereto is 420 nm). Namely, the wavelength λ1 corresponding to the resonance frequency f1 is in the infrared region, the wavelengths λ2, λ3 corresponding to the resonance frequencies f1, f2, respectively are in the visible region.

Further, in the formulae (1) to (5), when the resonance frequency f1 (wavelength λ1: 1000 nm) can be obtained, the period a, the radius r and outer diameter 4r (which is the width of the outer diameter) of the SRR 16 (=2(r+w)), are 875 nm, 125 nm and 600 nm, respectively. Furthermore, when the resonance frequency f2 (wavelength λ2: 600 nm) can be obtained, the period a, the radius r and the outer diameter 4r are 525 nm, 75 nm and 300 nm, respectively; and when the resonance frequency f3 (wavelength λ3: 420 nm) can be obtained, the period a, the radius r and the outer diameter 4r are 350 nm, 50 nm and 200 nm, respectively. In this case, since the thickness T of the SRR 16 is about the radius r or thinner than the radius r, the maximum width of the outer shape of the SRR 16 is 4r and the size of the outer shape of the SRR 16 (maximum width (4r)) is approximately ½ of the wavelength λ1 to λ3 corresponding thereto.

Moreover, in the embodiment, in a case that the relative permeability of the protective layer 18 is approximately 1 and the resonating element 14 is used as a substance having the real part μRe of the relative permeability that is considerably greater than 1 (for example, greater than 2), the wavelength of the illumination light may be set to λ1b, λ2b (frequencies f1b, λ2b corresponding thereto are lower than the resonance frequencies f1, f2), etc. in a range slightly longer than λ1, λ2 (similarly regarding λ3 as well). On the other hand, in a case that the resonating element 14 is used as a substance having the real part μRe of the relative permeability that is negative, the wavelength of the illumination light may be set to λ1a, λ2a (frequencies f1a, f2a corresponding thereto are higher than the resonance frequencies f1, f2), etc. in a range slightly shorter than λ1, λ2. By doing so, the resonating element 14 can be used as a substance (meta-material) in which the real part μRe of the relative permeability is considerably different from 1.

Figure 6A:
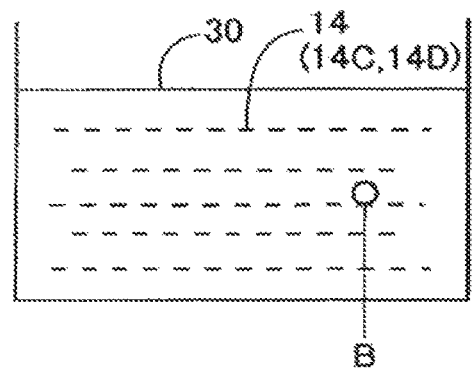
FIG. 6(A) is a diagram showing a liquid in which a large number of the resonating elements 14 are mixed.
Figure 6B:
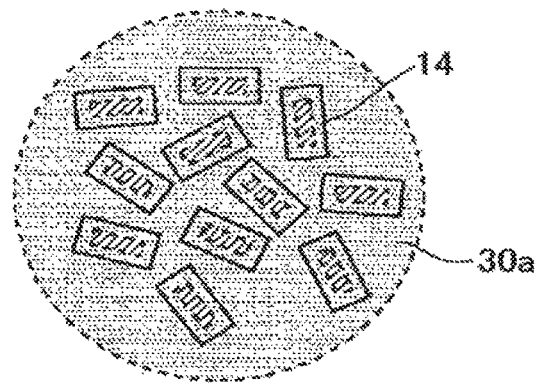
FIG. 6(B) is an enlarged view of a B portion shown in FIG. 6(A)

As an example shown in FIG. 6(A), a large number of the resonating elements 14 may be mixed (or dissolved) in a predetermined solvent to thereby produce an optical liquid 30. As shown in FIG. 6(B) which is an enlarged view, the liquid 30 is obtained, for example, by mixing (dissolving) a large number of the resonating elements 14 in a solvent 30a such as a pure water (purified water). Further, in a case that the solvent 30a is water (relative permittivity is positive), the resonating elements 14 are used, for example, under a condition that the wavelength is set to be λ1b or λ2b, etc. with which the real part μRe of the relative permeability is considerably greater than 1 as shown in FIG. 2. Under this condition, since the refractive index of the water 30 takes a value that is greater than, for example, 2, the liquid 30 can be used as a liquid having a high refractive index. Such a liquid having the high refractive index is usable, for example, as an immersion liquid for a liquid immersion type microscope, an immersion liquid for a liquid immersion type exposure apparatus (to be described later on), etc. The orientations (directions) of the respective resonators mixed in the liquid are random, and thus the liquid can have an isotropic optical characteristic.

Further, in a case that the solvent 30a is, for example, a liquid having a negative relative permittivity, the resonating elements 14 are used under a condition, for example, that the wavelength is set to be λ1a or λ2a, etc. with which the real part μRe of the relative permeability is negative as shown in FIG. 2. Under this condition, the refractive index of the liquid 30 takes a negative value. Such a liquid having the negative refractive index is, for example, filled in a cell and thus becomes usable as a super lens such as an optical element having a negative refractive index, as will be described later on.

Figure 6C:
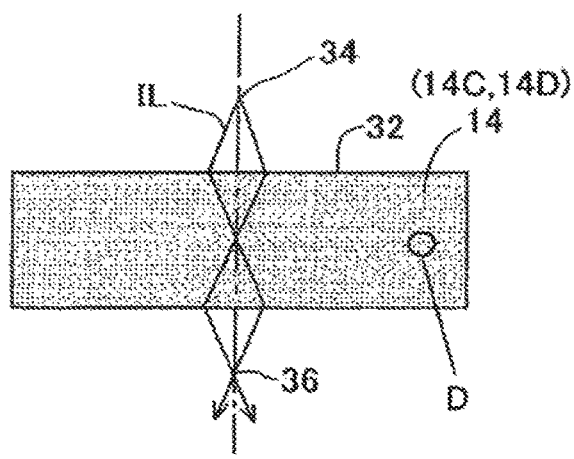
FIG. 6(C) is a diagram showing an optical lens including a large number of the resonating elements 14.
Figure 6D:
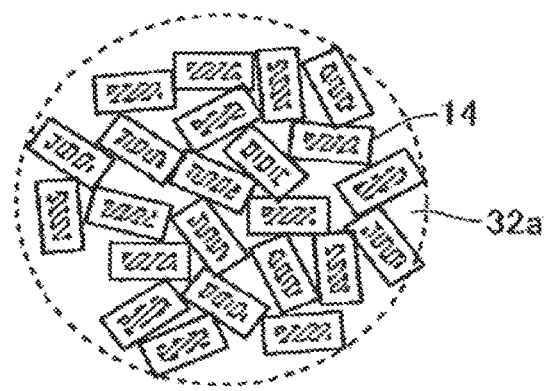
FIG. 6(D) is an enlarged view of a D portion shown in FIG. 6(C).

Furthermore, as shown in FIG. 6(C) as another example, a plate-shaped optical element 32 can be produced by solidifying the large number of resonating elements 14. As shown in FIG. 6(D) that is an enlarged view, the optical element 32 is obtained, for example, by mixing a medium 32a in a powdery form (filling agent) and the powder of the resonating elements 14 uniformly and then by solidifying the mixture by means of sintering, etc. Further, in a case that the protective layer 18 of each of the resonating elements 14 is formed of silicon dioxide (having positive relative permittivity) in a state that the medium 32a is absent, then the resonating elements 14 are used under a condition that the wavelength is set to be λ1b or λ2b, etc. with which the real part μRe of the relative permeability is considerably greater than 1 as shown in FIG. 2. Under this condition, since the refractive index of the optical element 32 takes, for example, a value greater than 2, it is possible to produce an optical lens having, for example, a refractive index greater than 2 by processing the optical element 32 into a spherical or aspherical lens.

On the other hand, in a case that the medium 32a is, for example, a substance having a negative relative permittivity (for example, a large number of minute thin metallic lines, or a dielectric having a small bandgap), the resonating elements 14 are used under a condition, for example, that the wavelength is set to be λ1a or λ2a, etc. with which the real part μRe of the relative permeability is negative as shown in FIG. 2. Under this condition, the refractive index of the optical element 32 takes a negative value. When an illumination light IL comes into such an optical element 32 having the negative refractive index from an external object point 34 as shown in FIG. 6(C), then the illumination light IL is imaged precisely to an external image point 36. Accordingly, the optical element 32 can be used as a so-called super lens.

Next, an example of a method for producing the powder 12 composed of the large number of resonating elements 14 as shown in FIG. 1(A) will be explained with reference to a flow chart shown in FIG. 3. This producing method uses a photolithography step, and an exposure apparatus 50 shown in FIG. 4(A) is used in the photolithography step.

Figure 4A:
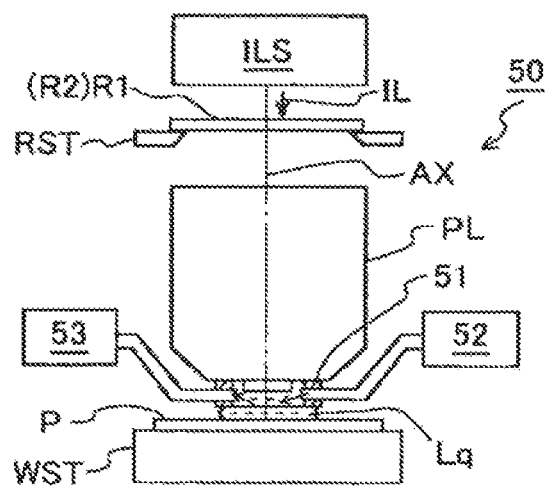
FIG. 4(A) is a diagram showing an exposure apparatus which is used in an exposure step.

In FIG. 4(A), the exposure apparatus 50 which is a scanning-exposure and liquid immersion type and is constructed of a scanning stepper includes, for example, an exposure light source (not shown) which generates an illumination light or illumination light beam (exposure light or exposure light beam) IL such as, for example, an ArF excimer laser (wavelength: 193 nm) or a KrF excimer laser (wavelength: 248 nm), etc.; an illumination optical system ILS which illuminates a reticle R1 (or a reticle R2, etc.) with the illumination light IL; a reticle stage RST which moves (scans) the reticle R1, etc.; a projection optical system PL which projects a pattern of the reticle R1, etc., onto a wafer P at a predetermined projection magnification β (for example, a reduction magnification of ¼, etc.); and a wafer stage WST which moves (scans and step-moves) the wafer P in a plane perpendicular to an optical axis AX of the projection optical system PL. The wafer P is, for example, a disc-shaped substrate (base member) having a diameter of 200 mm, 300 mm or 450 mm, etc., and formed of silicon, etc., and a predetermined plurality of numbers of layers of thin films and a photoresist (photosensitive material) are formed on the wafer P.

The exposure apparatus 50 is further provided with a local immersion mechanism including a nozzle head 51 which is arranged to surround a tip (end) portion of an optical member located at the lower end of the projection optical system PL; a liquid supply device 52 which supplies a liquid Lq such as a pure water (purified water) allowing the illumination light IL to transmit therethrough to a local space between the wafer P and the optical member arranged inside the nozzle head 51; and a liquid recovery device 53 which recovers the liquid Lq in the local space. Note that as the local liquid immersion mechanism, it is allowable to use, for example, the mechanism as disclosed in United States Patent Application Publication No. 2007/242247 or European Patent Application Publication No. 1420298, etc. Further, as the liquid Lq, it is also allowable to use the liquid 30 shown in FIG. 6(A) (in a case that the liquid is used in the wavelength region at which the liquid 30 exhibits a high refractive index).

As described above, the exposure apparatus 50 is a liquid immersion-type exposure apparatus. Therefore, it is possible to produce the SRR (split-ring resonator) 16 in FIG. 1(C) having the radius r of about 50 nm easily and highly precisely.

Figure 4B:
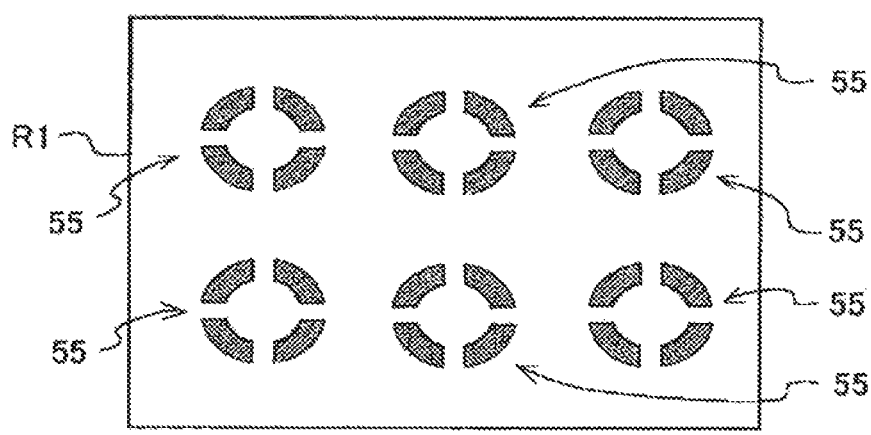
FIG. 4(B) is an enlarged plan view of a part of a pattern of a first reticle.

Further, FIG. 4(B) is an enlarged plane view showing a part or portion of a pattern formed in a pattern area in the reticle R1 shown in FIG. 4(A). In FIG. 4(B), a first pattern 55, which is formed of a light-shielding film and which is magnification of the SRR 16 shown in FIG. 1(C) by the reciprocal ratio of the projection magnification β, is formed in the pattern area in the reticle R1 in mutually orthogonal two directions at a predetermined period.

Figure 4C:
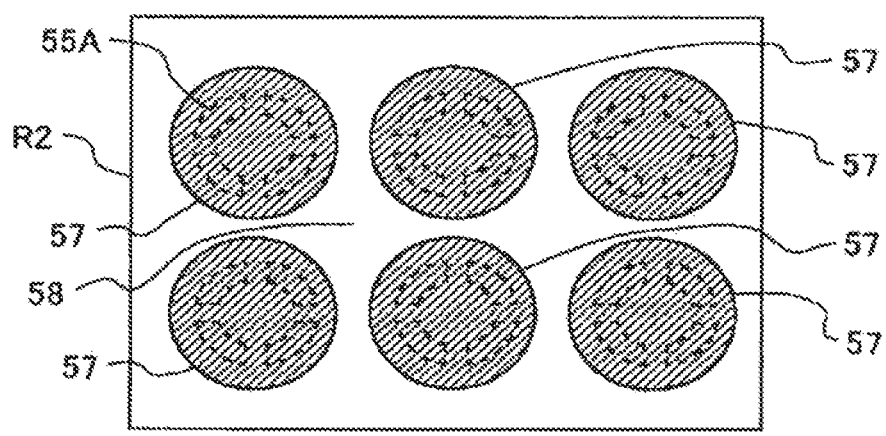
FIG. 4(C) is an enlarged plan view of a part of a pattern of a second reticle.

FIG. 4(C) is an enlarged plan view showing a part or portion of a pattern formed in the reticle R2 shown in FIG. 4(A). In FIG. 4(C), a second pattern 57, which is formed of a light-shielding film and which is magnification of the outer shape of the protective layer 18 of the resonating element 14 shown in FIG. 1(B) by the reciprocal ratio of the projection magnification β, is formed in the pattern area of the reticle R2 in mutually orthogonal two directions at a predetermined period which is same as the arrangement period for the first pattern 55. During the exposure, the second pattern 57 on the reticle R2 is positioned at a location same as a location 55A at which the first pattern 55 on the reticle R1 is arranged. Further, an area 58 between the second patterns 57 on the reticle R2 corresponds to a separation band for separating the plurality of resonating elements 14 away from one another.

Figure 3:
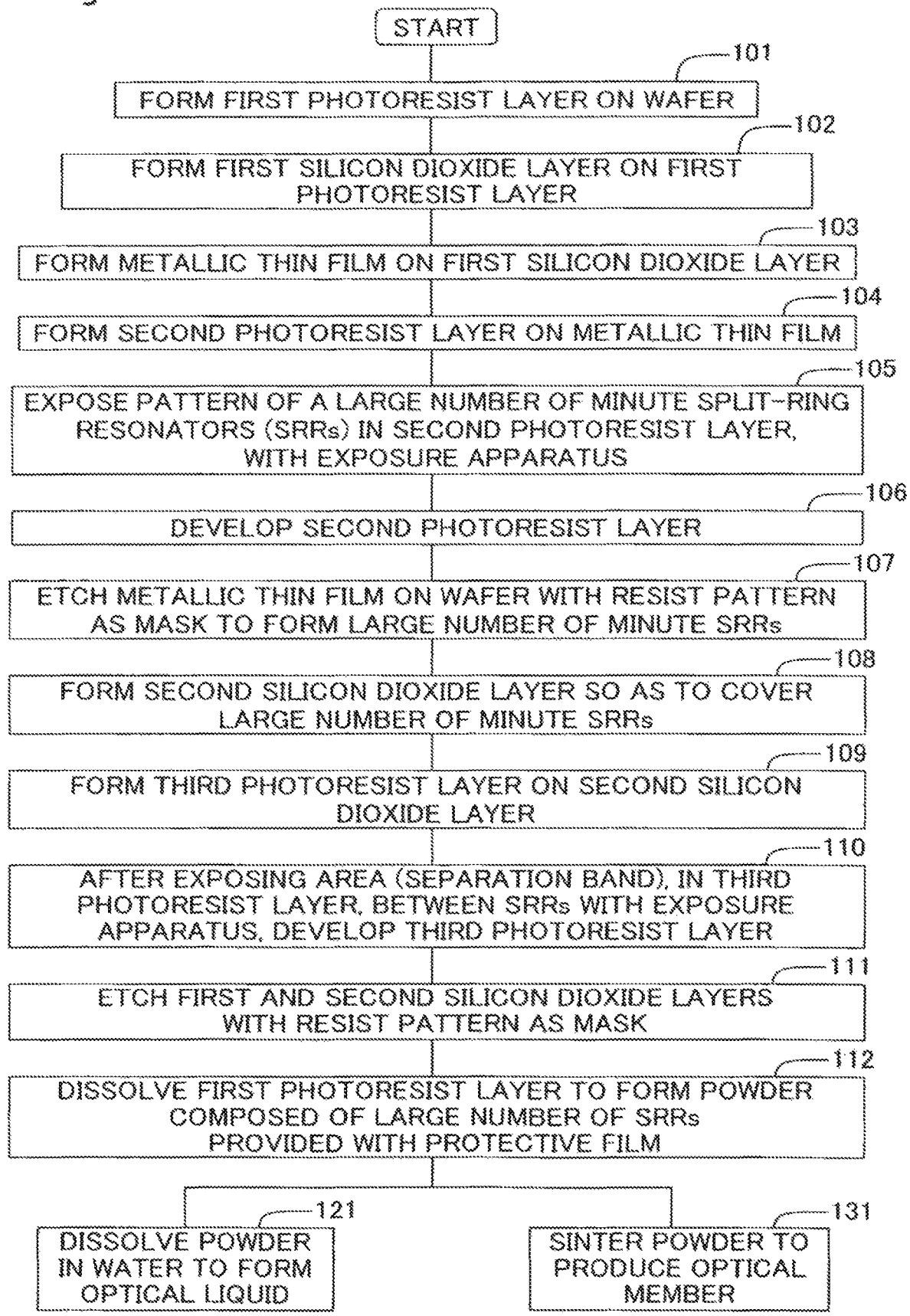
FIG. 3 is a flowchart showing an example of a method for producing a large number of the resonating elements 14.
Figure 5A:
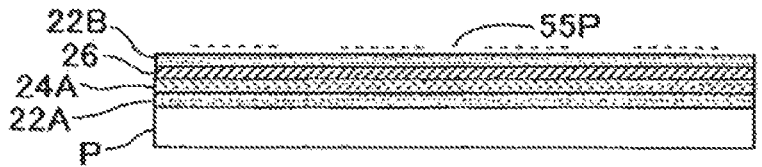
FIG. 5 (FIGS. 5(A) to 5(G)) is an enlarged cross-sectional view showing a construction of a part of a wafer in a plurality of steps during production process until a large number of the resonating elements 14 are produced.

Further, in Step 101 of FIG. 3, one lot of wafers each of which is, for example, a silicon wafer having a disc-shape and diameter of 300 mm is prepared. Although the following processes or steps are sequentially executed for processing the one lot of wafers, the processes will be explained as follows regarding one piece of the wafers P. FIGS. 5(A) to 5(G) are each an enlarged cross-sectional view showing a part of the construction of a multi-layered thin film (plurality of layered thin films) formed on the wafer P. At first, in a thin-film forming apparatus (not shown), a first photoresist layer 22A is formed on an entire surface of the wafer P as shown in FIG. 5(A). The first photoresist layer 22A is used not as a photosensitive layer for forming a resist pattern, but is used as a sacrifice layer for separating the large number of resonating elements 14 away from the wafer P at the end of the processes.

Next, in Step 102, a first silicon dioxide (SiO$_2$) layer 24A is formed on the first photoresist layer 22A on the wafer P. Then, in Step 103, a metallic thin film 26 made of a metal (in this case, for example, silver or aluminum, etc.) is formed on the first silicon dioxide layer 24A. Next, in Step 104, a second, positive-type photoresist layer 22B is formed on the metallic thin film 26. The second photoresist layer 22B and the first photoresist layer 22A are different types from each other, and the first photoresist layer 22A is not dissolved by a developing liquid and a dissolving liquid for the second photoresist layer 22B (and a photoresist layer 22C which will be described later on). Next, in Step 105, the wafer P is loaded on the exposure apparatus 50 shown in FIG. 4(A), and the second photoresist layer 22B in each of all the shot areas on the wafer P is exposed with a pattern of the minute SRR (split-ring resonator) composed of a large number of images 55P of the first patterns 55 of the reticle R1, by the exposure apparatus 50. Note that in this example, in FIG. 5(A), areas between the large number of images 55P are exposed by the illumination light.

Figure 5B:
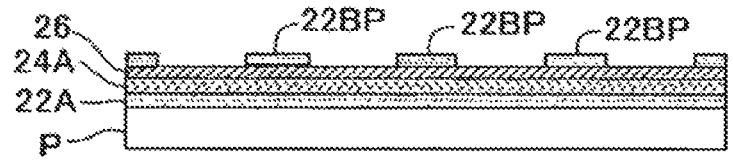
Figure 5C:
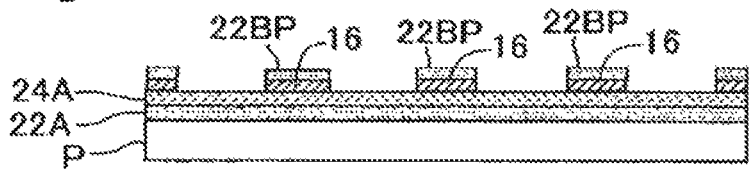

Next, in Step 106, the wafer P is transported to a coater/developer (not shown), and the second photoresist layer 22B on the wafer P is developed. By doing so, a resist pattern 22BP corresponding to the pattern of the SRR is formed, as shown in FIG. 5(B). Next, in Step 107, the wafer P is transported to an etching device (not shown) and the metallic thin film 26 on the wafer P is etched with the resist pattern 22BP serving as a mask, thereby forming a large number of minute SRRs 16 as shown in FIG. 5(C). Then, the resist pattern 22BP is removed.

Figure 5D:
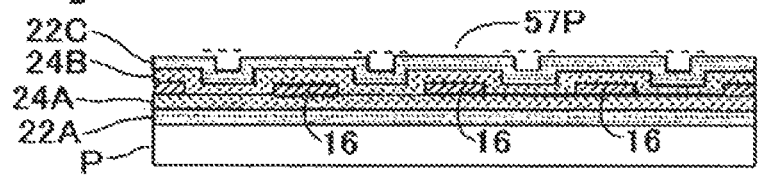
Figure 5E:
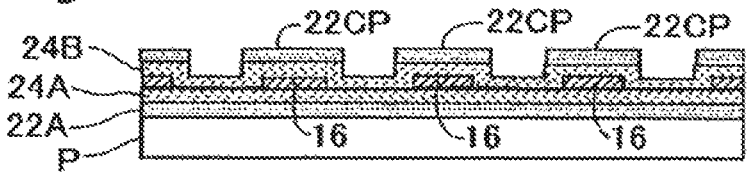

Next, in Step 108, the thin-film forming apparatus (not shown), a second silicon dioxide layer 24B is formed so as to cover the large number of minute SRRs 16 on the wafer P, as shown in FIG. 5(D). Then, in Step 109, a third, positive-type photoresist layer 22C is formed on the second silicon dioxide layer 24B of the wafer P at the coater/developer (not shown). Next, in Step 110, the wafer P is loaded on the exposure apparatus 50 shown in FIG. 4(A), and the third photoresist layer 22C on the wafer P is exposed with images 57P of the second patterns 57 of the reticle R2, by the exposure apparatus 50. By doing so, the area (separation band) between the large number of SRRs 16 on the wafer P is exposed. After that, the third photoresist layer 22C on the wafer P is developed in the coater/developer (not shown). With this, as shown in FIG. 5(E), a resist pattern 22CP is formed at an area at which the protective layer 18 as shown in FIG. 1(B) is to be formed, so as to cover the large number of the SRRs 16 on the wafer P.

Figure 5F:
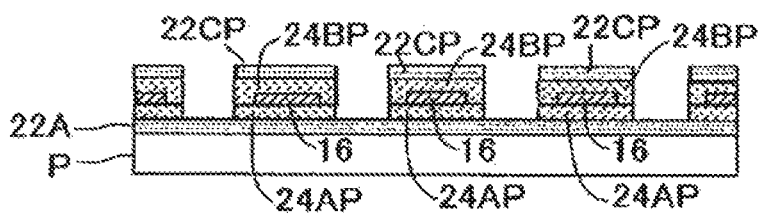
Figure 5G:
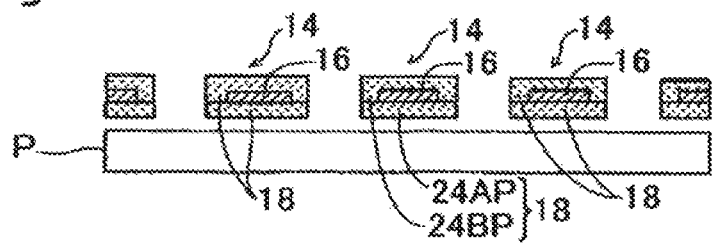

Next, in Step 111, the first and second silicon dioxide layers 24A, 24B are etched at the etching device (not shown) with the resist pattern 22CP on the wafer P serving as a mask, as shown in FIG. 5(F). By doing so, the large number of SRRs 16 are each covered entirely by silicon dioxide films 24AP and 24BP. Then, in Step 112, the wafer P is transported to the coater/developer (not shown), and the first photoresist layer 22A (sacrifice layer) on the wafer P is dissolved and removed. In order to remove the first photoresist layer 22A, it is allowable to perform the plasma asking. With this, as shown in FIG. 5(G), a large number of resonating elements 14, each of which is constructed of the SRR 16 covered by the protective layer 18 which is formed of the silicon dioxide films 24AP and 24BP, are produced in a state that the resonating elements 14 are separated from the wafer P. The powder 12 shown in FIG. 1(A) is obtained by collecting the large number of resonating elements 14 produced on one lot of the wafers P.

Note that in a case of producing further a greater number of the resonating elements 14, it is possible to re-use the one lot of wafers used in the production steps as described above. Accordingly, the wafers are not burden on the production cost.

Afterwards, in a case of producing the liquid 30 (optical liquid) shown in FIG. 6(A), the powder composed of the large number of resonating elements 14 is dissolved in a solvent 30a such as water, etc. inside a predetermined container in Step 121, followed by being agitated with an agitating device (not shown), as necessary.

On the other hand, in a case of producing the optical element 32 as shown in FIG. 6(C), the powder composed of the large number of resonating elements 14 is placed in a predetermined mould, followed by being sintered in Step 131. In this procedure, it is also allowable to previously and uniformly mix the powder of the resonating elements 14 and the medium 32a in a powdery state (filling agent).

The effects, etc. of the embodiment are as follows.

(1) The powder 12 of the embodiment is an optical material which is used as a component (a part or a portion) of a liquid or solid to which the illumination light is irradiated and includes a large number of the resonating elements 14; the resonating elements 14 are each formed by covering the minute SRR (split-ring resonator) 16 made of the metal (conductor) having the width smaller than the wavelength of the illumination light with the protective layer 18 formed of silicon dioxide, etc. (insulator).

According to the optical material of the embodiment, the SRR 16 is formed to have the size or dimension not more than about the wavelength of the visible light, thereby making it possible that the SRR 16 has the real part of the relative permeability different from 1 to a light having a wavelength which is in the infrared region or smaller than the infrared region. Further, since each of the SRRs 16 is covered by the protective layer 18, the plurality of SRRs 16 do not contact with one another, and thus are structurally stable.

Note that it is allowable to use, as the material for the protective layer 18, a semi-conductor such as silicon nitride (Si$_3$N$_4$), etc., other than the insulator.

(2) Further, in the large number of resonating elements 14 constructing the powder 12, the real part of the relative permeability (and consequently permeability) of the SRR 16 with respect to the illumination light may be negative and the real part of the relative permittivity (and consequently permittivity) of the protective layer 18 which covers each of the SRRs 16 with respect to the illumination light may be negative. With this, the resonating elements 14 or the liquid or solid containing the resonating elements 14 therein becomes an optical material having a negative refractive index to the illumination light.

(3) Further, the liquid 30 obtained by dissolving the powder 12 in the solvent 30a can be used as an optical liquid having, for example, a refractive index greater than 2 or having a negative refractive index.

(4) Furthermore, the optical element 32 formed by solidifying the powder 12 can be used as the optical material having, for example, a refractive index greater than 2 or having a negative refractive index.

(5) Moreover, the method for producing the large number of resonating elements 14 of the embodiment includes: Step 101 of forming the first photoresist layer 22A (sacrifice layer) on the wafer P; Step 102 of forming the first silicon dioxide layer 24A on the first photoresist layer 22A; Step 103 of forming the metallic thin film 26 on the first silicon dioxide film 24A; Steps 104 to 107 of patterning the plurality of SRRs 16 on the thin film 26; Steps 108 to 111 of forming the second silicon dioxide layer 24B so as to cover the plurality of SRRs 16; and Step 112 of removing the first photoresist layer 22A.

Accordingly, it is possible to mass-produce the powder 12 composed of the large number of resonating elements 14 of the embodiment with high precision by using the photolithography step.

(6) Further, the step of forming the second silicon dioxide layer 24B includes Steps 109 to 111 of removing the silicon dioxide layers 24A, 24B between the plurality of SRRs 16. Accordingly, by removing the first photoresist layer 22A next, the plurality of resonating elements 14 can be separated easily from one another.

(7) Furthermore, the optical liquid 30 shown in FIG. 6(A) can be produced by the step of mixing the powder 12 composed of the large number of resonating elements 14 in the solvent 30a (liquid such as water, etc.); and the step of agitating the solvent 30a in which the powder 12 is mixed. Accordingly, the liquid can be produced easily.

(8) Moreover, the optical element 32 shown in FIG. 6(C) can be produced by including the step of sintering the powder 12 composed of the large number of resonating elements 14. Accordingly, the optical element 32 can be produced easily.

Note that the following modifications can be made for the embodiment described above.

Figure 7A:
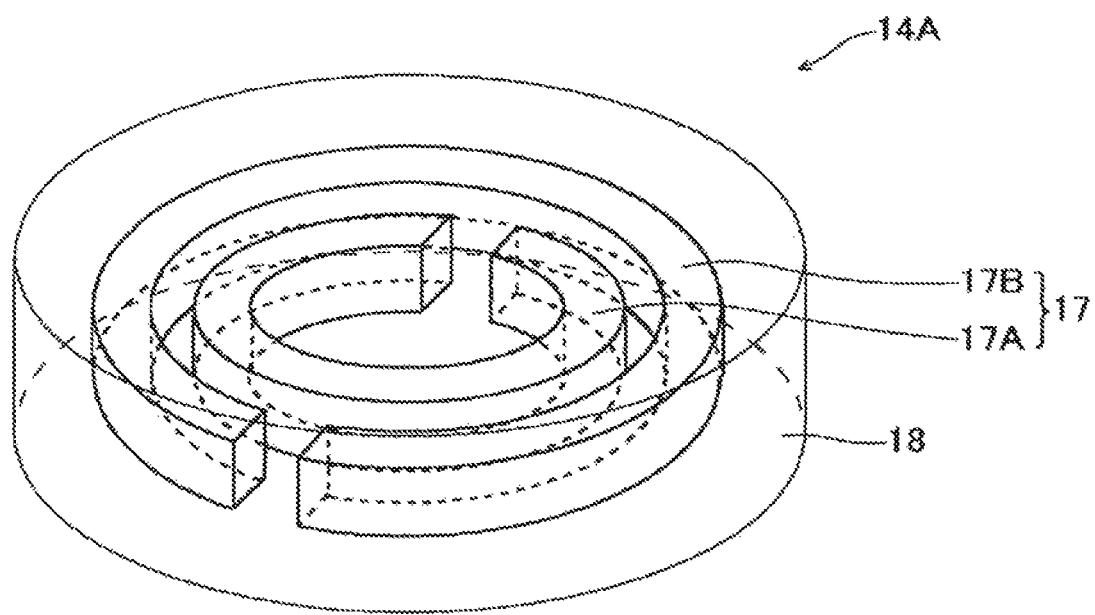
FIG. 7(A) is an enlarged perspective view of a resonating element 14 of a first modification.
Figure 7B:
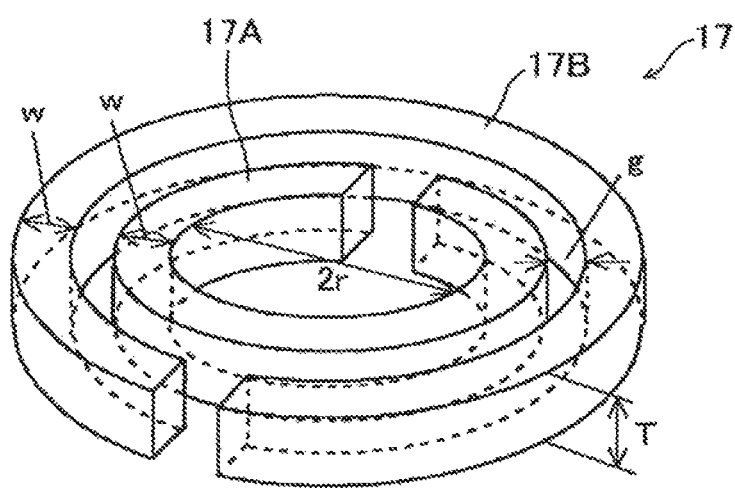
FIG. 7(B) is an enlarged perspective view of a split-ring resonator 17 shown in FIG. 7(A).

(1) It is allowable to use, instead of the resonating element 14 of the embodiment, a resonating element 14A (split-ring resonator provided with a protective film) having a construction in which a double split-ring resonator 17 is covered with the protective layer 18, as in a first modification shown in FIG. 7(A). As shown in FIG. 7(B), the split-ring resonator 17 is obtained by surrounding a first split-ring 17A having a radius of r and a width of w in the radial direction with a second split-ring 17B having a width of w at a spacing distance or gap g. Further, the thickness of each of the split-rings 17A, 17B is T. This resonating element 14A can also be easily produced by a production method similar to the production method of FIG. 3. Accordingly, the construction of the SRR (split-ring resonator) is arbitrary.

Figure 8A:
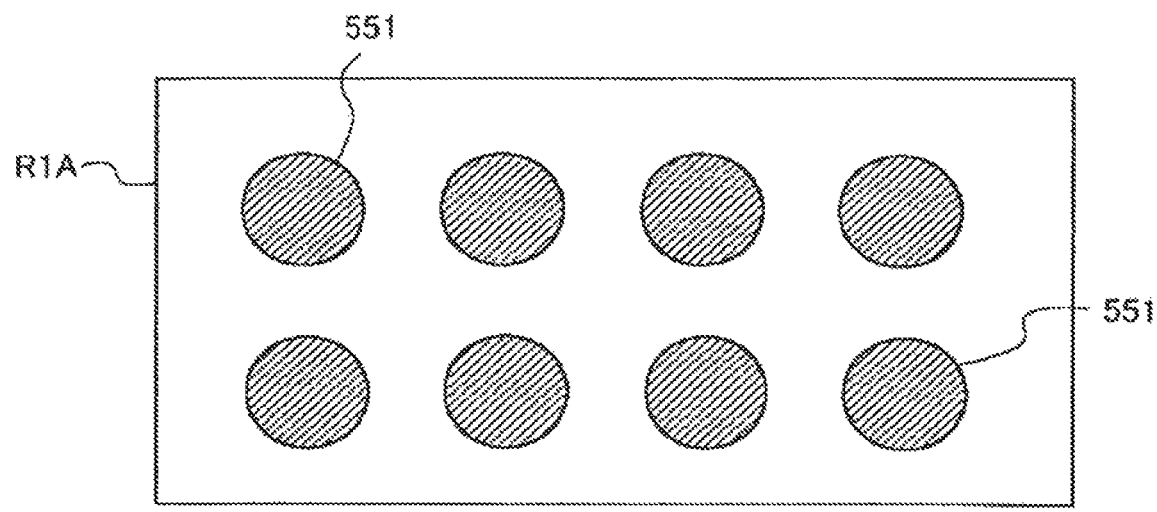
FIG. 8(A) is an enlarged plan view of a part of a pattern of a reticle R1A which is used in a second modification.
Figure 8B:
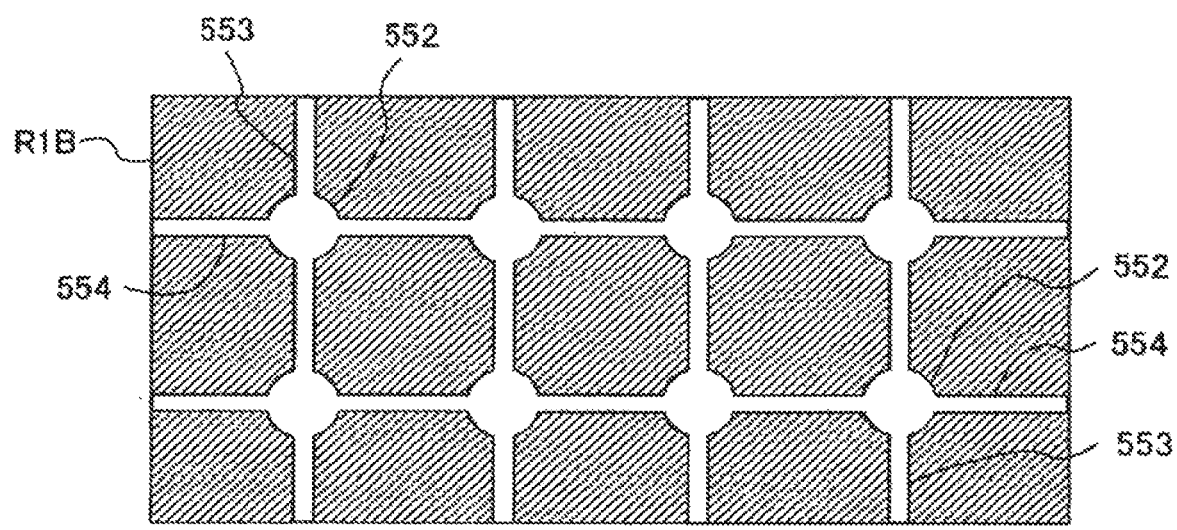
FIG. 8(B) is an enlarged plan view of a part of a pattern of a reticle R1B.

(2) Further, in a case that the image of the pattern of the first reticle R1 shown in FIG. 4(B) is exposed in Step 105 of FIG. 3 by using, for example, a dry-type exposure apparatus of which resolution is lower than that of the liquid-immersion type exposure apparatus 50 of the above-described embodiment, there is a fear that the resolution might not be sufficient. In such a case, it is allowable to divide the large number of first patterns 55 of the reticle R1 into two simpler-shaped patterns and to perform double-exposure with these two divided patterns. By doing so, it is possible to produce the large number of resonating elements 14 including the minute SRRs 16 highly precisely by using an exposure apparatus having a low resolution. As an example, the large number of first patterns 55 of the reticle R1 can be divided into circular patterns (annular patterns) 551 (first portion) constructed of a large number of light-shielding films formed on a reticle R1A of FIG. 8(A); and a pattern (second portion) which is formed in a light-shielding film of a reticle R1B of FIG. 8(B) and which includes, as light-transmitting portions, a plurality of vertical line patterns 553, a plurality of horizontal line patterns 554 and a large number of small circular patterns 552 each arranged at the intersection of the line patterns 553 and 554. The patterns of the reticles R1A and R1B of the second modification are simpler than the pattern of the reticle 1 and the pattern period is wide, which in turn makes it possible to expose the patterns of the reticles R1A and R1B on the wafer with a required resolution with an exposure apparatus having a lower resolution than that of the exposure apparatus 50.

Note that the large number of first pattern 55 of the reticle R1 may be divided into two or more patterns having simpler shapes, and the two or more simpler-shaped pattern may be subjected to the multiple-exposure.

(3) Further, in a case of producing the optical element 32 of FIG. 6(C), it is allowable to use, as the medium 32a to be mixed with the large number of resonating elements 14, a solid obtained by solidifying a liquid in the sol state by the Sol-Gel process. The Sol-Gel process is a chemical reaction in which the sol is turned into the gel state by heating, etc. and then ceramics, etc., is synthesized. In this case also, in the step of mixing the large number of resonating elements 14 (powder 12) and the medium 32a, the medium 32a is a liquid in the sol state, and thus the large number of resonating elements 14 and the medium 32a can be mixed uniformly.

As the liquid in the sol state for the medium 32a, it is possible to use, as an example, tetraethoxysilane ($Si(OR_4)$). Here, —OR is ethoxy group (—$OC_2H_5$), and —R is ethyl group (—$C_2H_5$). The reaction in this case is, for example, as follows.

At first, when the powder 12 of the resonating elements 14 is mixed to a pure water solution (Sol) of tetraethoxysilane and is then heated, the aqueous solution of tetraethoxysilane becomes colloid of triethoxysilane hydroxide and ethanol as follows, due to the hydrolysis. The heating temperature is, for example, 600 degrees Celsius to 1,100 degrees Celsius, and ethanol is evaporated and recovered.

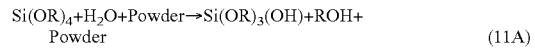

$$Si(OR)_4 + H_2O + \text{Powder} \rightarrow Si(OR)_3(OH) + ROH + \text{Powder} \quad (11A)$$

When the hydrolysis is continued further, the triethoxysilane hydroxide, uniformly mixed with the powder (resonating elements 14) assumes a structure such as that of silicon dioxide, due to the following polymerization reaction.

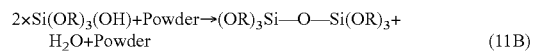

$$2 \times Si(OR)_3(OH) + \text{Powder} \rightarrow (OR)_3Si\text{—}O\text{—}Si(OR)_3 + H_2O + \text{Powder} \quad (11B)$$

Accordingly, in the optical element 32 which is finally formed, the resonating elements 14 and the solvent 32a are uniformly mixed and the refractive index of the medium 32a is approximately same as the refractive index of the protective layer 18 (provided that the protective layer 18 is formed of silicon dioxide) of the resonating elements 14. Therefore, the reflection on the interface is lowered and the transmittance with respect to the illumination light becomes high.

Note that in this reaction, when the amount of the pure water is too much and the concentration of the solid in the solvent 32a is small, then the pure water may be evaporated.

(4) Further, in the resonating elements 14 of the embodiment described above, the real part of the permittivity is positive and the real part of the relative permittivity is also positive (for example, real number greater than 1). Therefore, even when a large number of the resonating elements 14 are merely collected, the refractive index remains to be positive.

Figure 9A:
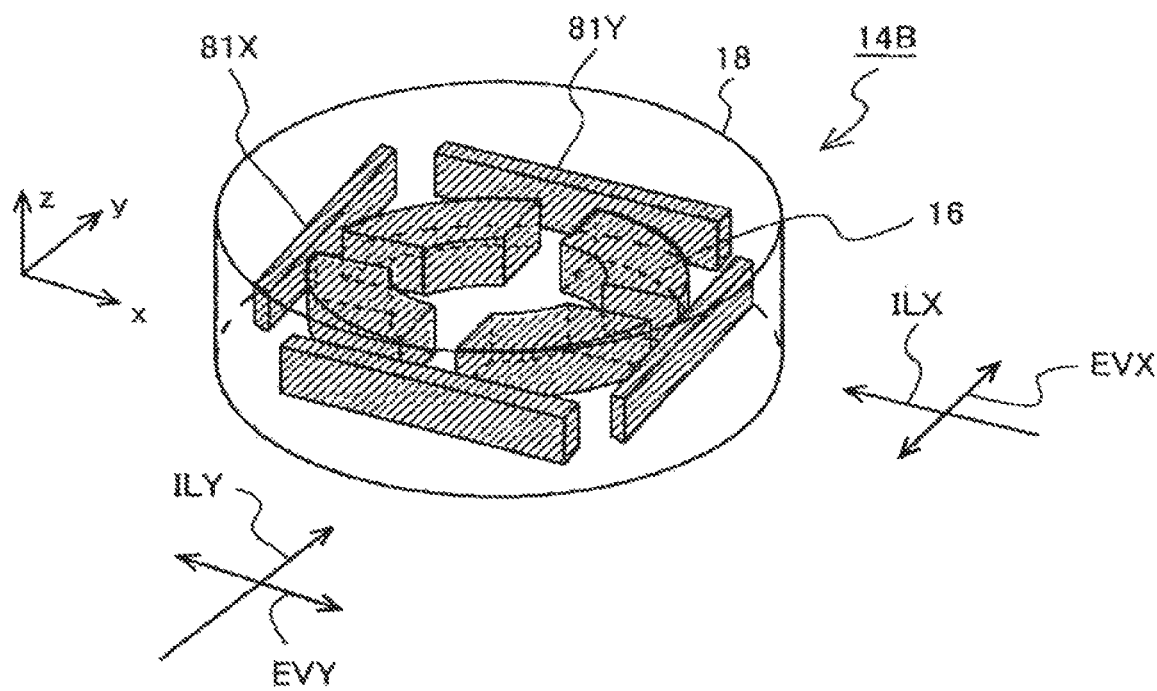
FIG. 9(A) is an enlarged perspective view of a resonating element 14B of a third modification.

In view of this, as a resonating element 14B of a third modification shown in FIG. 9(A), it is allowable to form a pair of line patterns 81X elongated in the y-direction and a pair of line patterns 81Y elongated in the x-direction so as to sandwich (interpose) each of the SRRs (split-ring resonators) 16 therebetween in the x-direction and the y-direction, respectively, inside the protective layer 18. The line patterns 81X, 81Y are minute thin lines formed of a conductor (metal, etc.) which is same as that forming the SRR 16.

In this modification, it is assumed that the wavelength of a light (light beam) ILY is within a range in which the real part μRe of the relative permeability of FIG. 2 takes a negative value (for example, a value slightly smaller than the wavelength λ3) provided that the light ILY is a light in which a vibration direction EVY of the electric field vector is parallel to the x-axis (linearly polarized in the x-direction) and the vibration direction of the magnetic field vector is parallel to the z-axis and that the light ILY comes into the resonating element 14B in the y-direction. In this case, the line width (cross-sectional area) and the length in the x-direction of the line pattern 81Y and the arrangement such as the x-direction and y-direction period, etc. of the large number of line patterns 81Y are set so that the real part of the permittivity of the resonating elements 14B to the light ILY is negative (the real part of the relative permittivity is also negative).

As a result, the resonating element 14B (or a substance obtained by collecting the resonating elements 14B) becomes a meta-material in which the refractive index to the light ILY takes a negative value.

Note that an example of construction of the plurality of thin metallic lines, in which the real part of the permittivity is negative with respect to a microwave, is described in Literature by D. R. Smith et al. and entitled "Composite medium with simultaneously negative permeability and permittivity", Phys. Rev. Lett. (the United States), 84, pp. 4184-4187 (2000) (hereinafter referred to as "Reference Literature B"). The line patterns 81Y of the modification shown in FIG. 9(A) is formed to have the minute shape and arrangement so that the real part of the permittivity to the visible light takes a negative value.

Further, it is presumed that the shape and arrangement of the large number of line patterns 81X elongated in the y-direction inside the resonating element 14B are same as the shape and arrangement of the line patterns 81Y. In this case, when a light ILX (provided that the light ILX has a wavelength same as that of the light ILY), in which a vibration direction EVX of the electric field vector is parallel to the y-axis (linearly polarized in the y-direction) and the vibration direction of the magnetic field vector is parallel to the z-axis, comes into the resonating element 14B in the x-direction, then the real part of the permittivity of the resonating element 14B to the light ILX also becomes negative, due to the line pattern 81X. Accordingly, the refractive index of the resonating element 14B to the light ILX also takes a negative value. Therefore, by mixing the large number of resonating elements 14B in the liquid or by solidifying the large number of resonating elements 14B to thereby form an optical element, it is possible to produce an optical liquid or optical element having a negative refractive index to a light having a predetermined wavelength.

Figure 9B:
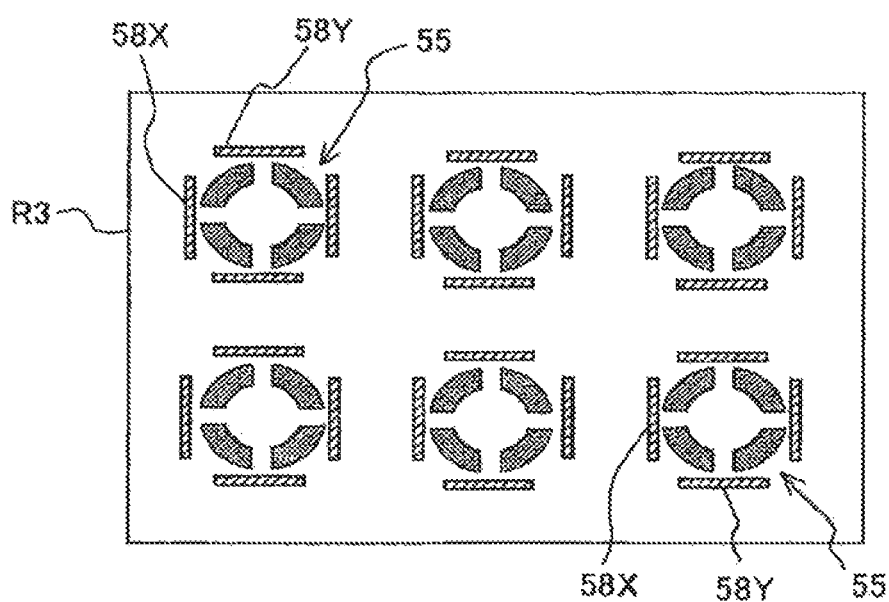
FIG. 9(B) is an enlarged plan view of a part of a pattern of a reticle which is used for producing the resonating element 14B.

Next, in a case that the resonating element 14B of FIG. 9(A) is produced, it is allowable to use, in Step 105 of FIG. 3, a reticle R3 in which line patterns 58X, 58Y formed of a light-shielding film and corresponding to the line patterns 81X, 81Y are formed around each of the first patterns 55 as shown in FIG. 9(B), instead of using the reticle R1 of FIG. 4(B).

By doing so, the line patterns 81X, 81Y can be patterned together and at the same time with the large number of SRRs 16 in the metallic thin film 26 of the wafer P.

[Second Embodiment]

Next, a second embodiment will be explained with reference to FIGS. 10 to 16. In the following description, components or parts which are shown in FIGS. 10(A) to 12(B) and FIGS. 14(A) to 16 and which correspond to those shown in FIGS. 1(A) to 1(C) and FIGS. 4(B) to 13, are designated by the same reference numerals, and any detailed explanation therefor will be simplified or omitted.

Figure 10A:
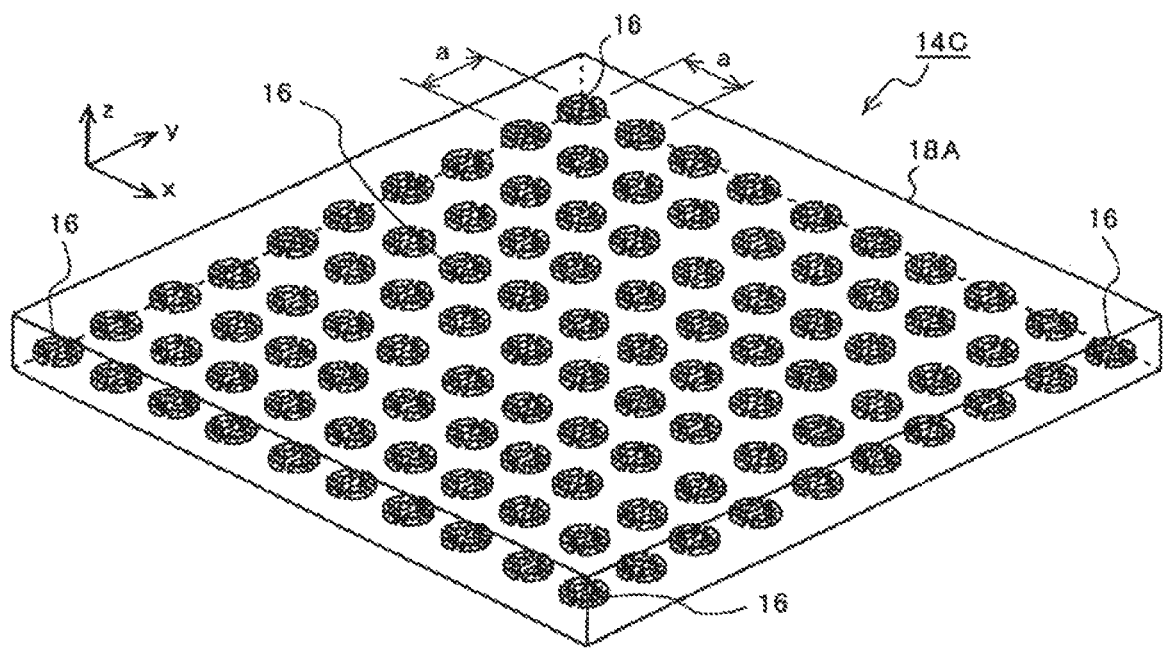
FIG. 10(A) is an enlarged perspective view of a resonating element 14C of a second embodiment.
Figure 10B:
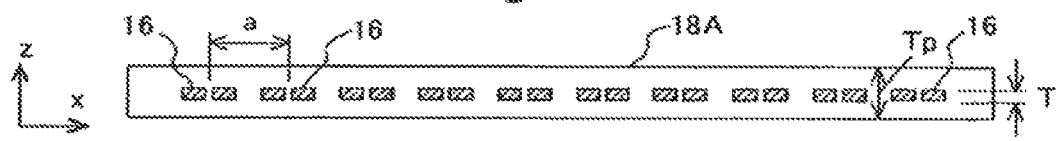
FIG. 10(B) is a side view of the resonating element 14C shown in FIG. 10(A)
Figure 10C:
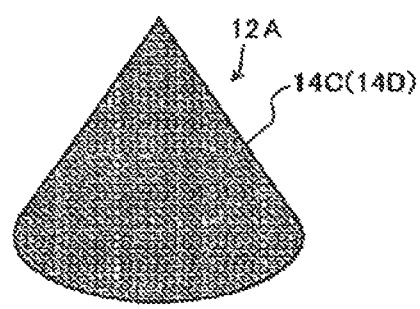
FIG. 10(C) is a perspective view of powder of an optical material of the second embodiment.

FIG. 10(C) shows powder 12A of an optical material of the second embodiment. The powder 12A is obtained by collecting a large number of minute resonating elements 14C or 14D. FIG. 10(A) is an enlarged perspective view of one resonating element 14C constituting the powder 12A, and FIG. 10(B) is a side view of the resonating element 14C shown in FIG. 10(A). In FIG. 10(A), there is assumed x-axis and y-axis in a rectangular coordinate system in a plane, and z-axis is assumed as an axis perpendicular to the plane. The resonating element 14C is constructed by covering a plurality of minute split-ring resonators 16 (or SRRs 16), which are arranged in the x-direction and the y-direction at a period (pitch) of "a" to be arranged in K rows×L columns, with a rectangular plate-shaped protective layer 18A composed of an insulator such as silicon dioxide ($SiO_2$), aluminum oxide ($Al_2O_3$), or the like.

"K" is an arbitrary integer not less than 1, and "L" is an arbitrary integer not less than 2. Note that K and L may be same integers not less than 2. In the embodiment, as an example, K=L=10. In this case, 100 pieces of the SRR 16 are arranged in 10 rows×10 columns in the resonating element 14C. Note that the protective layer 18A may be, for example, formed such that four corner portions thereof are rounded. Each of the SRRs 16 is made of a metal such as silver (Ag), gold (Au), copper (Cu) or aluminum (Al), etc., and has a shape obtained by dividing a ring axisymmetric with respect to an axis parallel to the z-axis into four portions (see FIG. 12(B)). As shown in FIG. 10(B), a thickness (width in the z-direction) T of the SRR 16 is smaller than the pitch "a", and a thickness Tp of the protective layer 18A is about three times the thickness T.

Figure 11A:
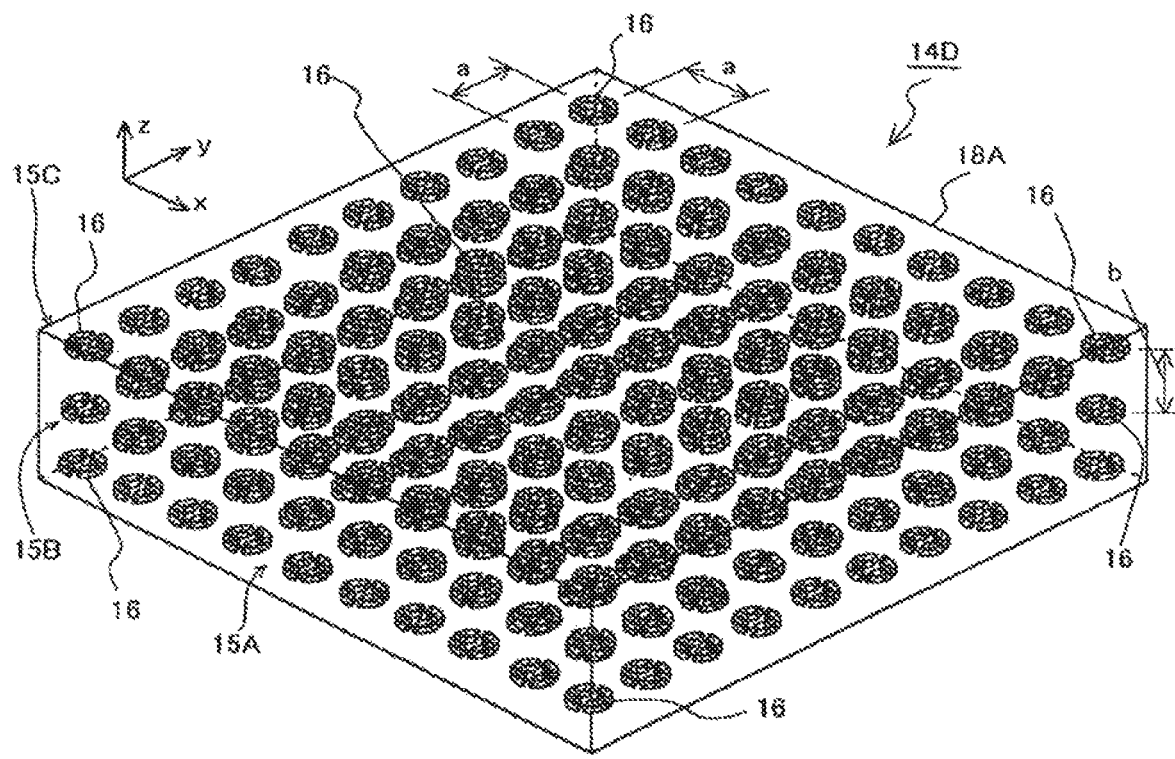
FIG. 11(A) is an enlarged perspective view of another resonating element 14D of the second embodiment.
Figure 11B:
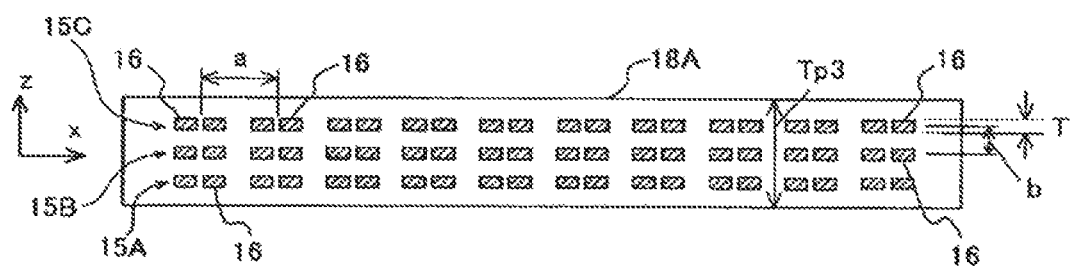
FIG. 11(B) is a side view of the resonating element 14D shown in FIG. 11(A).

Note that it is allowable to use a resonating element 14D as shown in FIG. 11(A) and having a plurality of layers each including a plurality of the SRRs 16 as the optical material for the powder 12A as shown in FIG. 10(C), instead of using the resonating element 14C as shown in FIG. 10(A) and having one layer of the plurality of SRRs 16 formed therein. In FIG. 11(A), the resonating element 14D is obtained by covering, with the protective layer 18A, a plurality of SRRs 16 which are arranged at the period (pitch) of "a" in K rows×L columns in the x-direction and the y-direction and are arranged in M layers such as a first layer 15A, a second layer 15B, a third layer 15C, etc., in the z-direction at a period (pitch) of "b". In this case, K is an arbitrary integer not less than 1, and M are each an arbitrary integer not less than 2. Note that K and L may be same integers not less than 2, and that the resonating element 14C shown in FIG. 10(A) corresponds to the arrangement in which M=1.

As shown in the side view of FIG. 10(B), the thickness Tp3 of the protective layer 18A of the resonating element 14D is approximately (3×T+(M−1)b). Note that in FIG. 11(A), the resonating element 14D has a three-layered structure (L=3). Other than this, as an example, the relationship among K, L and M may be K=L=M=10. In such a case, 1000 pieces of the SRRs 16 are arranged in 10 rows×10 columns×10 layers in the resonating element 14D.

Figure 12A:
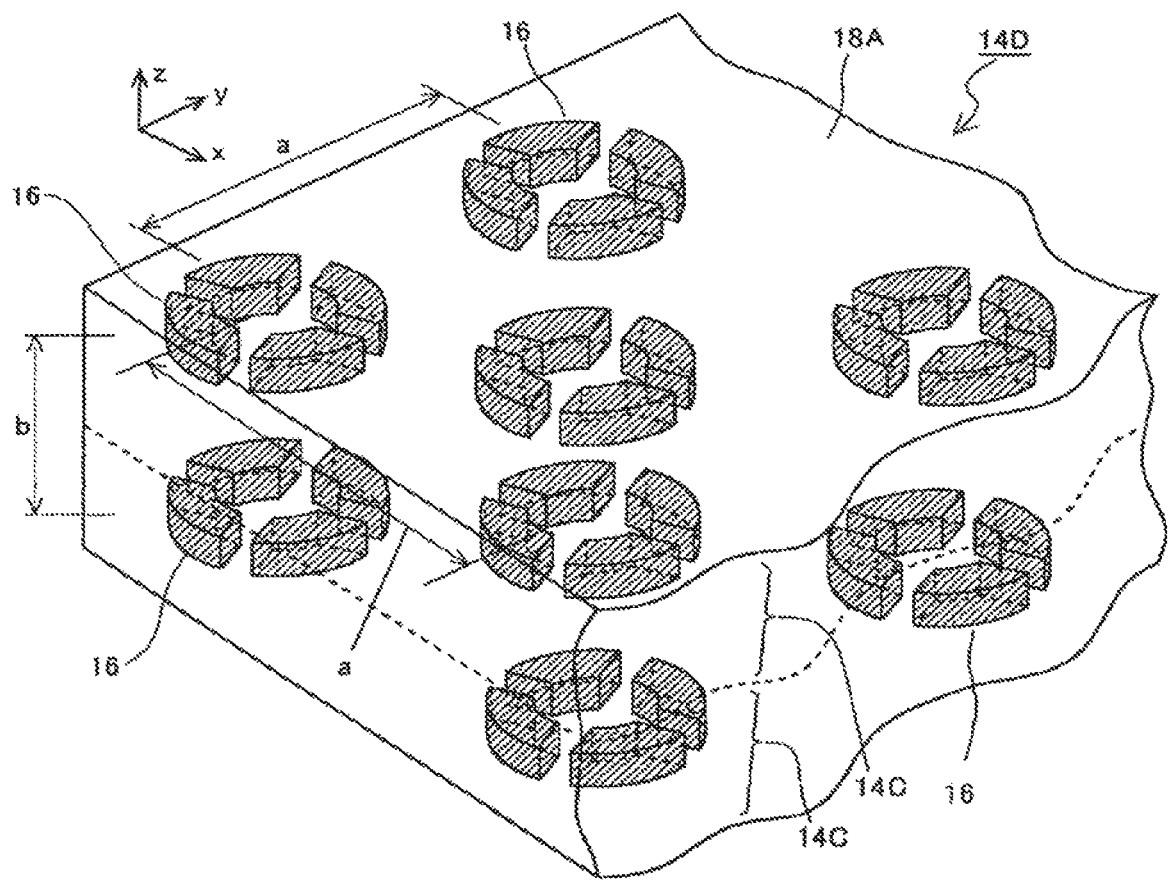
FIG. 12(A) is an enlarged perspective view of a plurality of split-ring resonators (SRRs) in the resonating element 14D.

FIG. 12(A) is an enlarged view showing a portion of the resonating element 14D (note that the resonating element 14D has a two-layered structure). The resonating element 14D can be considered as a plurality of the resonating elements 14C which are overlaid (stacked) in the z-direction. Note that although the large number of resonating elements 14D in the powder 12A of FIG. 10(C) are arranged randomly, the resonating elements 14D approximately arranged as shown in FIG. 12(A) are included in the powder 12A at a certain ratio.

Figure 12B:
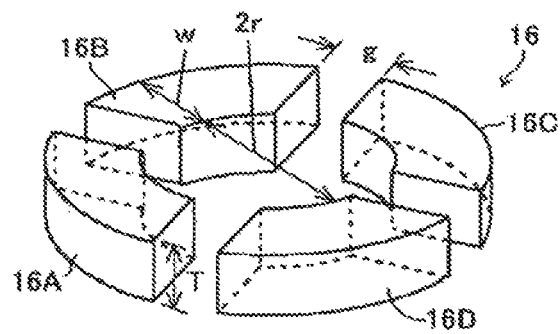
FIG. 12(B) is an enlarged perspective view of one SRR.

FIG. 12(B) shows one of the SRRs (split-ring resonators) 16 shown in FIG. 12(A). The shape and material of the SRR 16 is same as those of the SRR 16 shown in FIG. 1(B) of the first embodiment. Namely, in FIG. 12(B), the SRR 16 is constructed of four fan-shaped members 16A, 16B, 16C and 16D obtained by splitting or dividing a ring, which has an inner radius r, a width w in the radial direction and a thickness T, in the circumference direction of the ring with a spacing distance g. Note that a split number N (N=2, 3, 4, 5, . . . ) by which the SRR is split is arbitrary.

The arrangement of the plurality of SRRs 16, in the resonating element 14D of FIG. 12(A), on the rectangular coordinate system (x, y, z) is same as the arrangement of the plurality of SRRs 16 in the resonating element 14 of FIG. 1(B) of the first embodiment. Accordingly, similarly to the first embodiment, the effective relative permeability μeff of the plurality of SRR 16 arranged as shown in FIG. 12(A) with respect to an illumination light having a predetermined wavelength λ (provided that the angular frequency is ω) is represented by the formula (1).

According to the formula (1), the real part μRe of the effective relative permeability μeff becomes considerably greater than 1 in the predetermined ranges in each of which the frequency f [THz] of the illumination light is smaller than the predetermined resonance frequency (f1, f2, f3, etc.) and takes a negative value in the predetermined ranges in each of which the frequency f is greater than the predetermined resonance frequency, as shown in FIG. 2, depending on the shape and arrangement of the SRRs 16. Furthermore, as the resonance frequency f becomes higher from f1 to f3, the absolute value of the real part μRe becomes smaller. Note that the resonance frequency is substantially defined by the parameters of the shape of SRR 16 (r, w, T, etc.), and the contribution by the arrangement periods a, b of the SRRs 16 are considered as relatively small.

Similarly to the first embodiment, according to Reference Literature A, in a case that the radius r of the SRR 16 is same as the width w of the SRR 16, the period b is 350 nm, the spacing distance g is 33 nm, the thickness T is 2.5 times the penetration depth, and the relative permittivity εr is 2.25, the resonance frequency f1 is 300 THz (the wavelength λ1 corresponding thereto is 1000 nm (1 μm)), the resonance frequency f2 is 500 THz (the wavelength λ2 corresponding thereto is 600 nm), and the resonance frequency f3 is 700 THz (the wavelength λ3 corresponding thereto is 420 nm).

Further, the period a, the radius r and the outer diameter 4r in the formulae (1) to (5) when the resonance frequency f3 (the wavelength λ3: 420 nm) can be obtained are 350 nm, 50 nm and 200 nm, respectively. In this case, since the thickness T of the SRR 16 is approximately same as or thinner than the radius r, the maximum width of the outer shape of the SRR 16 is 4r, and the size or dimension of the outer shape (the maximum width (4r)) of the SRR 16 is approximately ½ of the wavelengths λ1 to λ3 corresponding thereto.

As described above, provided that the arrangement of the SRRs 16 in the resonating element 14D is 100 rows×100 columns×100 layers in a case that each of the periods a and b are 350 nm, then the size of the resonating element 14D is approximately 35×35×35 μm³. Accordingly, the resonating element 14C, 14D has a size of μm-order, and thus the resonating element 14C, 14D can be easily handled, thereby making it possible to suppress, for example, inadvertent aggregation of a plurality of the elements.

Further, in the embodiment, in a cases that the relative permittivity of the protective layer 18A is approximately 1 and that the resonating elements 14C (or 14D) are used as a substance having the real part μRe of the relative permeability which is considerably greater than 1 (for example, greater than 2), the wavelength of the illumination light may be set, for example, to λ1b, λ2b (frequencies f1b, f2b corresponding thereto are lower than the resonance frequencies f1, f2), etc. in a range slightly longer than λ1, λ2 (similarly regarding λ3 as well). On the other hand, in a case that the resonating elements 14C (or 14D) are used as a substance having the real part μRe of the relative permeability that is negative, the wavelength of the illumination light may be set to λ1a, λ2a (frequencies f1a, f2a corresponding thereto are higher than the resonance frequencies f1, f2), etc. in a range slightly shorter than λ1, λ2. By doing so, the resonating element 14D (or 14C) can be used as a substance (meta-material) in which the real part μRe of the relative permeability is considerably different from 1.

As an example shown in FIG. 6(A), a large number of the resonating elements 14C (or 14D) may be mixed (or dissolved) in a predetermined solvent to thereby produce an optical liquid 30. The liquid 30 is obtained, for example, by mixing (dissolving) a large number of the resonating elements 14C (or 14D) in a solvent such as a pure water (purified water). Further, in a case that the solvent is water (relative permittivity is positive), the resonating elements 14C are used, for example, under a condition that the wavelength is set to be λ1b or λ2b, etc. with which the real part μRe of the relative permeability is considerably greater than 1 as shown in FIG. 2. Under this condition, since the refractive index of the water 30 is greater than, for example, 2, the liquid 30 can be used as a liquid having a high refractive index. Such a liquid having the high refractive index is usable, for example, as an immersion liquid for a liquid immersion type microscope, an immersion liquid for a liquid immersion type exposure apparatus (to be described later on), etc. The orientations (directions) of the respective resonators mixed in the liquid are random, and thus the liquid can have an isotropic optical characteristic.

Further, in a case that the solvent is, for example, a liquid having a negative relative permittivity, the resonating elements 14C (or 14D) are used, for example, under a condition that the wavelength is set to be λ1a or λ2a, etc. with which the real part μRe of the relative permeability is negative as shown in FIG. 2. Under this condition, the refractive index of the liquid 30 takes a negative value. Such a liquid having the negative refractive index is, for example, filled in a cell and thus becomes usable as a super lens such as an optical element having a negative refractive index, as will be described later on.

Furthermore, as shown in FIG. 6(C) as another example, a plate-shaped optical element 32 can be produced by solidifying the large number of resonating elements 14C (or 14D). The optical element 32 is obtained, for example, by mixing a medium in a powdery form (filling agent) and the powder of the resonating elements 14C, 14D uniformly and then by solidifying the mixture by means of sintering, etc. Further, in a case that the protective layer 18A of each of the resonating elements 14C, 14D is formed of silicon dioxide (having positive relative permittivity) in a state that the medium is absent, then the resonating elements 14C, 14D are used under a condition that the wavelength is set to be λ1*b* or λ2*b*, etc. with which the real part μRe of the relative permeability is considerably greater than 1 as shown in FIG. 2. Under this condition, since the refractive index of the optical element 32 takes, for example, a value greater than 2, it is possible to produce an optical lens having, for example, a refractive index greater than 2 by processing the optical element 32 into a spherical or aspherical lens.

On the other hand, in a case that the medium is, for example, a substance having a negative relative permittivity (for example, a large number of minute thin metallic lines, or a dielectric having a small bandgap), the resonating elements 14C (or 14D) are used, for example, under a condition that the wavelength is set to be λ1*a* or λ2*a*, etc. with which the real part μRe of the relative permeability is negative as shown in FIG. 2. Under this condition, the refractive index of the optical element 32 takes a negative value. When an illumination light IL comes into such an optical element 32 having the negative refractive index from an external object point 34 as shown in FIG. 6(C), then the illumination light IL is imaged precisely to an external image point 36. Accordingly, the optical element 32 can be used as a so-called super lens.

Figure 13B:
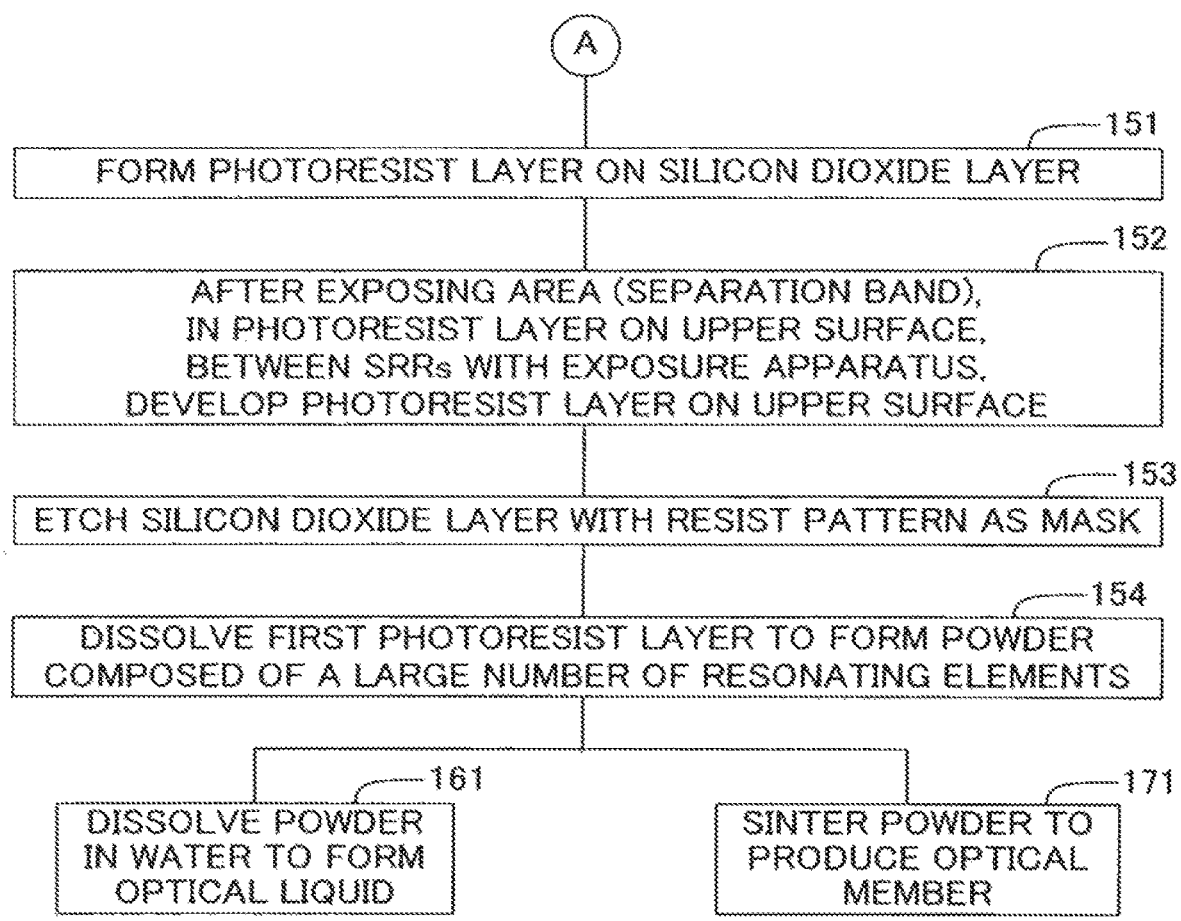
FIG. 13 (13A, 13B) is a flowchart showing an example of a method for producing the resonating elements 14C, 14D.

Next, an example of a method for producing the powder 12A composed of the large number of single-layered resonating elements 14C as shown in FIG. 10(A) or the large number of multi-layered resonating elements 14D as shown in FIG. 11(A) will be explained with reference to a flow chart shown in FIG. 13 (FIGS. 13A, 13B). This producing method uses a photolithography step, and the exposure apparatus 50 of the liquid-immersion type and shown in FIG. 4(A) is used in the photolithography step. Since the exposure apparatus 50 is a liquid immersion-type exposure apparatus as described above, the SRRs (split-ring resonators) 16 having the diameter r of about 50 nm in FIG. 12(B) can be produced easily and highly precisely.

Figure 14A:
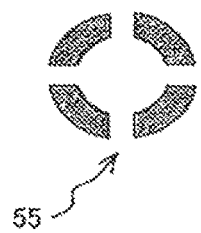
FIG. 14(A) is an enlarged view of a pattern for SRR.
Figure 14B:
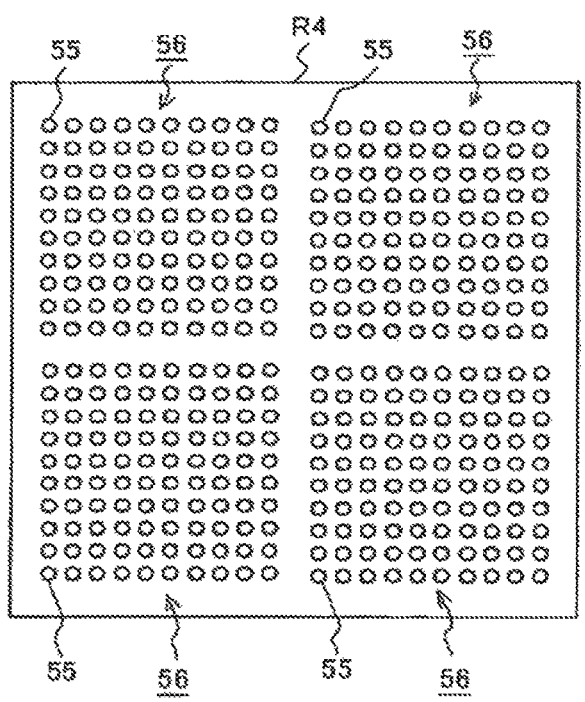
FIG. 14(B) is an enlarged plan view of a part of a pattern of a first reticle.

Further, FIG. 14(B) is an enlarged plane view showing a part or portion of a pattern formed in a pattern area in a first reticle R4 used in the exposure apparatus 50 shown in FIG. 4(A). In FIG. 14(B), first patterns 56, each of which is formed of a light-shielding film and is magnification of the SRRs 16 arranged for example in 10 rows×10 columns in the resonating element 14C as shown in FIG. 10(A) by the reciprocal ratio of the projection magnification β, are formed in the pattern area of the reticle R4 while being arranged in mutually orthogonal two directions at a predetermined spacing distance. Each of the first patterns 56 is formed by arranging a ring-shaped pattern 55, which is formed of a split-ring shaped, light-shielding film as shown in FIG. 14(A) that is an enlarged view and corresponding to one piece of the SRRs 16, for examples in 10 rows×10 columns.

Figure 14C:
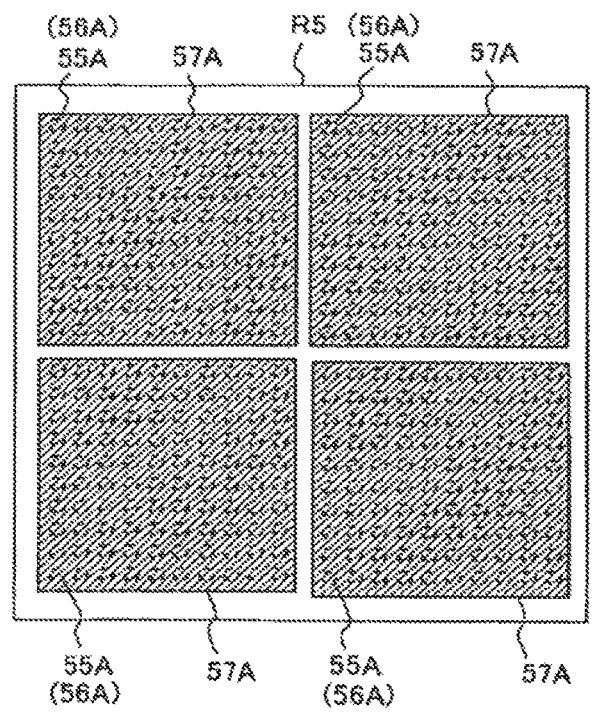
FIG. 14(C) is an enlarged plan view of a part of a pattern of a second reticle.

FIG. 14(C) is an enlarged plan view showing a part or portion of a pattern formed in a second reticle R5 which is used in the exposure apparatus 50. In FIG. 14(C), second patterns 57A, each of which is formed of a light-shielding film and is magnification of the outer shape of the protective layer 18A on the xy-plane of the resonating element 14C, 14D by the reciprocal ratio of the projection magnification β, are formed in the pattern area of the reticle R5 while being in mutually orthogonal two directions at a predetermined period which is same as the arrangement period for the first patterns 56. During the exposure, each of the second patterns 57A on the reticle R5 is positioned at a location same as a location 56A (including locations 55A at which a large number of the ring-shaped patterns 55 are arranged respectively) at which one of the first patterns 56 on the reticle R4 is arranged. Further, an area between the second patterns 57A on the reticle R5 corresponds to a separation band for separating the plurality of resonating elements 14C, 14D away from one another.

Figure 15A:
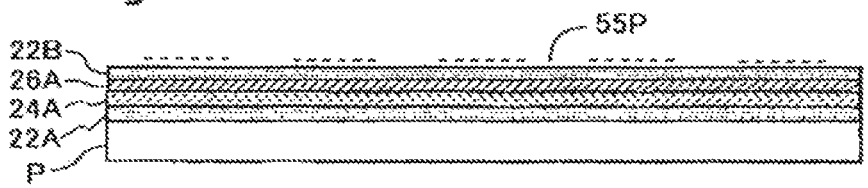
FIG. 15 (FIGS. 15(A) to 15(G)) is an enlarged cross-sectional view showing a construction of a part of the upper surface of a wafer in a plurality of first half steps during a process for producing the resonating element 14D.

Further, in Step 141 of FIG. 13, one lot of wafers each of which is, for example, a silicon wafer having a disc-shape and diameter of 300 mm is prepared. Although the following processes or steps are sequentially executed for processing the one lot of wafers, the processes will be explained as follows regarding one piece of the wafers P. FIGS. 15(A) to 15(G) and FIGS. 16(A) to 16(G) are each an enlarged cross-sectional view showing a part of the construction of a multi-layered thin film (plurality of layered thin films) formed on the wafer P. At first, in a thin-film forming apparatus (not shown), a first photoresist layer 22A is formed on an entire surface of the wafer P as shown in FIG. 15(A). The first photoresist layer 22A is used not as a photosensitive layer for forming a resist pattern, but is used as a sacrifice layer for separating the large number of resonating elements 14C, 14D away from the wafer P at the end of the processes.

Next, in Step 142, a first silicon dioxide ($SiO_2$) layer 24A is formed on the first photoresist layer 22A on the wafer P. Then, in Step 143, a first metallic thin film 26A formed of a metal (in this case, for example, silver or aluminum, etc.) on the first silicon dioxide layer 24A. Next, in Step 144, a second, positive-type photoresist layer 22B is formed on the metallic thin film 26. The second photoresist layer 22B and the first photoresist layer 22A are different types from each other, and the first photoresist layer 22A is not dissolved by a developing liquid and a dissolving liquid for the second photoresist layer 22B (and a photoresist layer 22C, etc. which will be described later on). Next, in Step 145, the wafer P is loaded on the exposure apparatus 50 shown in FIG. 4(A), and the second photoresist layer 22B in each of all the shot areas on the wafer P is exposed with images of a large number of the first patterns 56 (a large number of images 55P of the ring-shaped patterns 55 for the SRRs 16) of the reticle R4, by the exposure apparatus 50. Note that in this example, areas between the large number of images 55P are exposed by the illumination light in FIG. 15(A).

Figure 15B:
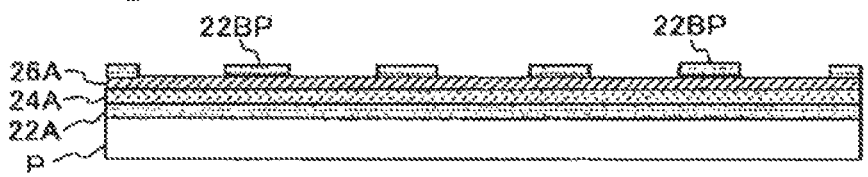
Figure 15C:
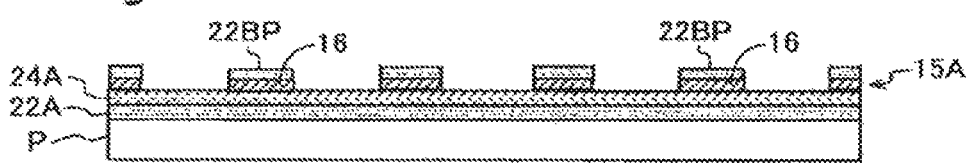

Next, in Step 146, the wafer P is transported to a coater/developer (not shown), and the second photoresist layer 22B on the wafer P is developed. By doing so, a resist pattern 22BP corresponding to the SRRs 16 (images 55P) is formed, as shown in FIG. 15(B). Next, in Step 147, the wafer P is transported to an etching device (not shown) and the metallic thin film 26A on the wafer P is etched with the resist pattern 22BP serving as a mask, thereby forming a large number of minute SRRs 16 of the first layer 15A as shown in FIG. 15(C). Then, the resist pattern 22BP is removed.

Figure 15D:
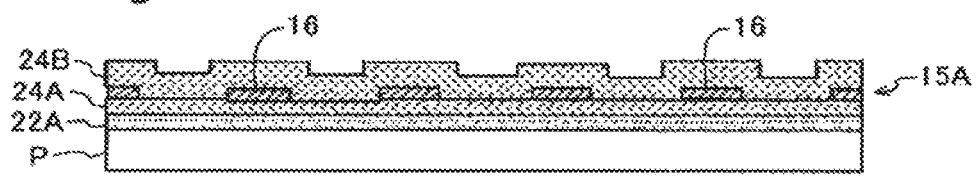
Figure 15E:
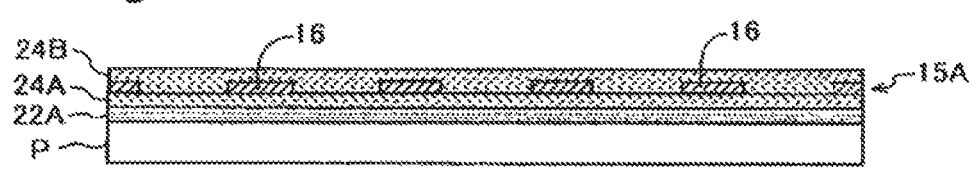
Figure 15F:
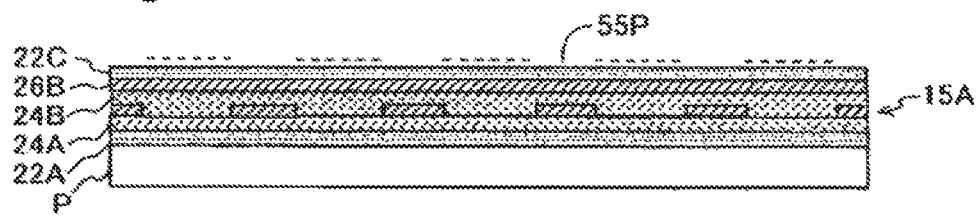

Next, in Step 148, in the thin-film forming apparatus (not shown), a second silicon dioxide layer 24B is formed so as to cover the large number of minute SRRs 16 on the wafer P, as shown in FIG. 15(D). Next, in Step 149, a surface of the silicon dioxide layer 24B is planarized (flattened) by the chemical-mechanical polishing (CMP), as shown in FIG. 15(E). Next, in Step 150, confirmation is made whether or not a layer of the SRRs 16 (here, a second layer of SRRs 16) is to be formed on the first layer 15A. In a case that the second layer is not to be formed, namely in a case that a single-layered resonating element 14C of FIG. 10(A) is to be produced, then the procedure proceeds to Step 151. Here, provided that the second layer is to be formed, the procedure returns to Step 143 and a metallic thin film 26B which is same as the metallic thin film 26A is formed on the silicon dioxide layer 24B and then a third photoresist layer 22C is formed on the metallic thin film 26B (Step 144), as shown in FIG. 15(F). Next, the photoresist layer 22C in each of all the shot areas on the wafer P is exposed with the large number of images of the first patterns 56 (images 55P of the ring-shaped patterns 55) of the reticle R4, by the exposure apparatus 50.

Figure 15G:
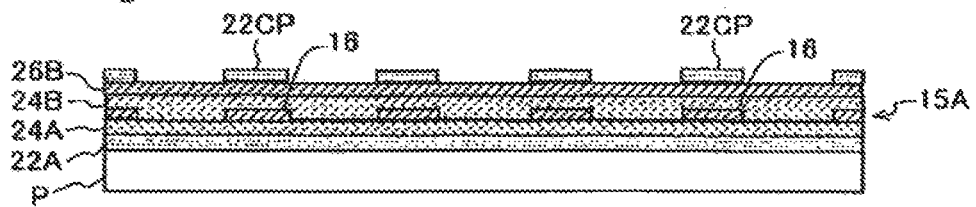
Figure 16A:
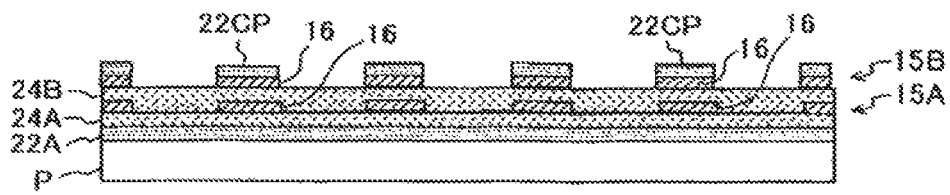
FIG. 16 (FIGS. 16(A) to 16(G)) is an enlarged cross-sectional view showing the construction of the part of the upper surface of the wafer in a plurality of latter half steps during the process for producing the resonating element 14D.

Next, the photoresist layer 22C on the wafer P is developed (Step 146), thereby forming a resist pattern 22CP corresponding to the SRRs 16 (images 55P), as shown in FIG. 15(G). Next, the metallic thin film 26B on the wafer P is etched with the resist pattern 22CP serving as a mask (Step 147), thereby forming a large number of minute SRRs 16 of the second layer 15B as shown in FIG. 16(A). Then, the resist pattern 22CP is removed.

Figure 16B:
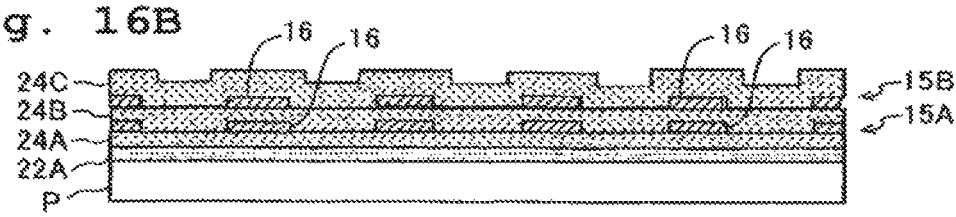
Figure 16C:
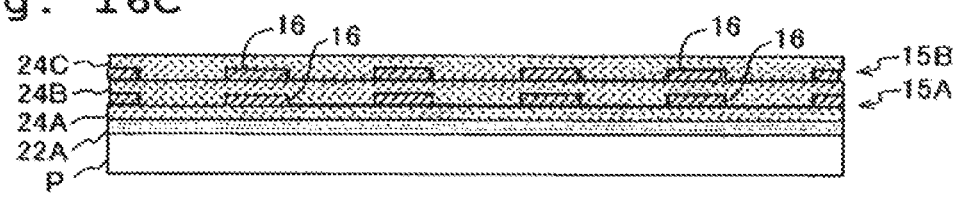
Figure 16D:
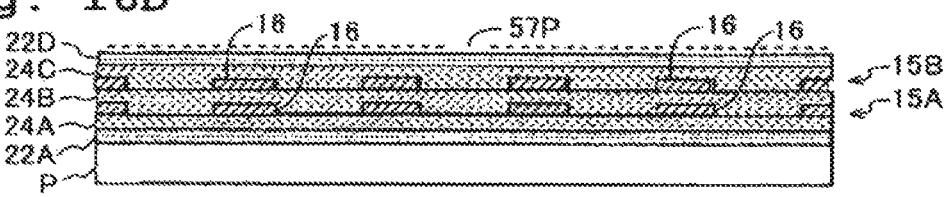
Figure 16E:
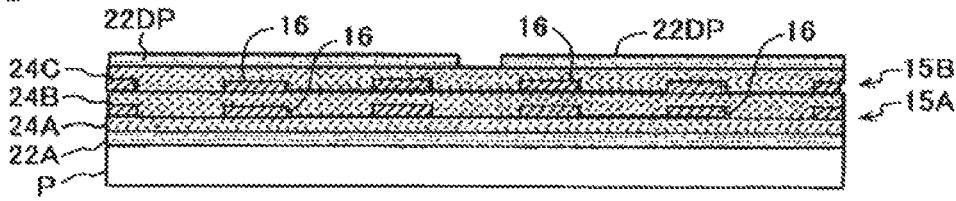

Next, a third silicon dioxide layer 24C is formed so as to cover the large number of SRRs 16 of the second layer 15B, as shown in FIG. 16(B) (Step 148). Next, a surface of the silicon dioxide layer 24C is planarized as shown in FIG. 16(C). Next, in Step 150, provided that a third layer is not to be formed on the second layer 15B in this case, and the procedure proceeds to Step 151 in which a fourth, positive-type photoresist layer 22D is formed on the silicon dioxide layer 24C of the wafer P in the coater/developer (not shown), as shown in FIG. 16D. Next, in Step 152, the wafer P is loaded on the exposure apparatus 50 shown in FIG. 4(A), and the photoresist layer 22D on the wafer P is exposed with the images 57P of the second patterns 57 of the reticle R5, by the exposure apparatus 50. By doing so, the area (separation band) between the large number of resonating elements 14D (or 14C, same as the following description) on the wafer P is exposed. After that, the photoresist layer 22D on the wafer P is developed in the coater/developer (not shown). With this, as shown in FIG. 16(E), a resist pattern 22DP is formed at an area, at which the protective layer 18A as shown in FIG. 11(A) or FIG. 10(A) is to be formed, so as to cover the large number of the SRRs 16 in each of the resonating elements 14D on the wafer P.

Figure 16F:
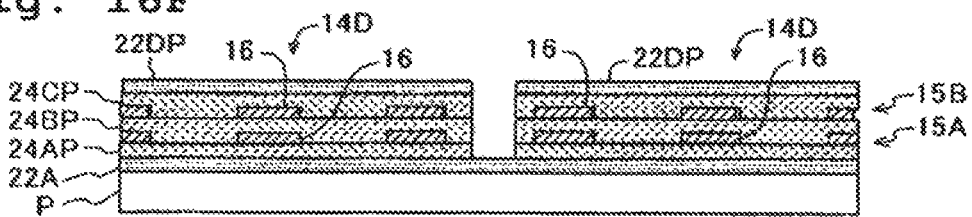
Figure 16G:
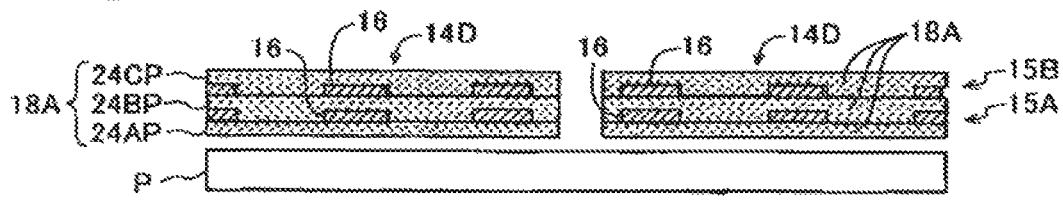

Next, in Step 153, the plurality of silicon dioxide layers 22A to 24C are etched at the etching device (not shown) with the resist pattern 22DP on the wafer P serving as a mask, as shown in FIG. 16(F). By doing so, the large number of SRRs 16 in the resonating element 14D are each covered entirely by the silicon dioxide films 24AP, 24BP and 24CP. Then, in Step 154, the wafer P is transported to the coater/developer (not shown), and the first photoresist layer 22A (sacrifice layer) is dissolved and removed. In order to remove the first photoresist layer 22A, it is allowable to perform the plasma asking. With this, as shown in FIG. 16(G), a large number of resonating elements 14D, each constructed of the large number of SRRs 16 of the first and second layers 15A, 15B which are covered by the protective layers 18A formed of the silicon dioxide films 24AP, 24BP and 24CP, are produced in a state that the resonating elements 14D are separated from the wafer P. Note that in a case wherein the second layer 15B is not formed, a large number of the resonating elements 14C is produced. The powder 12A shown in FIG. 10(C) is obtained by collecting the large number of resonating elements 14D (or 14C) produced on one lot of the wafers P.

Note that in a case of producing a resonating element 14D including three or more layers of the large number of SRRs 16, the operations in Steps 143 to 149 may be repeated as the number of the layers. Further, note that in a case of producing further a greater number of the resonating elements 14C, 14D, it is possible to re-use the one lot of wafers used in the production steps as described above. Accordingly, the wafers are not burden on the cost.

Afterwards, in a case of producing the liquid 30 (optical liquid) shown in FIG. 6(A), the powder composed of the large number of resonating elements 14C or 14D is dissolved in a solvent 30a such as water, etc. inside a predetermined container in Step 161, followed by being agitated with an agitating device (not shown), as necessary.

On the other hand, in a case of producing the optical element 32 as shown in FIG. 6(C), the powder composed of the large number of resonating elements 14C or 14D is placed in a predetermined mould, followed by being sintered. In this procedure, it is also allowable to previously and uniformly mix the powder of the resonating elements 14C, 14D and the medium 32a (filling agent) in a powdery state. Note that in the powder 12A, the liquid 30 and the optical element 32, it is allowable to use a large number of the single-layered resonating elements 14C and the large number of the multiple-layered resonating elements 14D in a mixed manner.

The effects, etc. of the embodiment are as follows.

(1) The powder 12A of the embodiment is an optical material which is used as a component (a part or a portion) of a liquid or solid to which the illumination light is irradiated and includes the plurality of minute resonating elements 14C, 14D; the resonating elements 14C, 14D each include the plurality of SRRs (split-ring resonator) 16 made of the metal (conductor) having the width that is approximately same as or smaller than the wavelength of the illumination light and arranged apart from one another and the protective layer 18A which is formed of silicon dioxide, etc. (insulator) and which covers the plurality of SRRs 16.

According to the optical material of the embodiment, the SRR 16 is formed to have the size or dimension not more than about the wavelength of the visible light, thereby making it possible that the SRR16 has the real part of the relative permeability different from 1 to a light having a wavelength which is in the infrared region or smaller than the infrared region. Further, since each of the SRRs 16 is covered by the protective layer 18, the plurality of SRRs 16 do not contact with one another, and thus are structurally stable. Furthermore, since the relative positions of the plurality of SRRs 16 are substantially fixed, the characteristics such as the resonating frequencies f1 to f3, etc. can be easily controlled by controlling the relative positions.

Note that it is allowable to use, as the material for the protective layer 18A, a semi-conductor such as silicon nitride ($Si_3N_4$), etc., other than the insulator.

(2) Further, the plurality of SRRs 16 in the resonating element 14C are arranged at the period "a" along the x- and y-axes perpendicular to each other; and the plurality of SRRs 16 in the resonating element 14D are arranged at the period "a" along the x- and y-axes perpendicular to each other and arranged at the period b along the z-axis. Thus, according to the resonating elements 14C or 14D, since the two-dimensional or three-dimensional arrangement of the SRRs 16 are fixed, it is possible to control the characteristics such as the resonating frequency, etc., further easily and precisely.

(3) Furthermore, in the large number of resonating elements 14C, 14D constructing the powder 12A, the real part of the relative permeability (and consequently permeability) of the SRRs 16 with respect to the illumination light may be negative and the real part of the relative permittivity (and consequently permittivity) of the protective layer 18A which covers the SRRs 16 with respect to the illumination light may be negative. With this, the resonating elements 14C, 14D or the liquid or solid containing the resonating elements 14C, 14D therein becomes an optical material having a negative refractive index to the illumination light.

(4) Moreover, the liquid 30 obtained by dissolving the powder 12A in the solvent can be used as an optical liquid having a refractive index for example greater than 2 or having a negative refractive index.

(5) Further, the optical element 32 formed by solidifying the powder 12A can be used as the optical material having a refractive index for example greater than 2 or having a negative refractive index.

(6) Furthermore, the method for producing the large number of resonating elements 14C of the embodiment includes: Step 141 of forming the first photoresist layer 22A (sacrifice layer) on the wafer P; Step 142 of forming the first silicon dioxide layer 24A on the first photoresist layer 22A; Step 143 of forming the metallic thin film 26A on the first silicon dioxide layer 24A; Steps 144 to 147 of patterning the plurality of SRRs 16 on the thin film 26A; Steps 148 and 149 of forming the second silicon dioxide layer 24B so as to cover the plurality of SRRs 16; Steps 151 to 153 of removing a portion or part of the silicon dioxide layer 24A and a portion or part of the silicon dioxide layer 24B in accordance with the arrangement of the SRRs 16; and Step 154 of removing the first photoresist layer 22A.

According to this producing method, it is possible to highly precisely mass-produce the powder 12A composed of the large number of resonating elements 14C of the embodiment by using the lithography step.

(7) Further, between the operation of Step 148 performed for the first time and the operations of Steps 151 to 153, this producing method is capable of performing Step 149 of planarizing (flattening) the surface of the silicon dioxide layer 24B, Step 143 of forming the second metallic thin film 26B on the silicon dioxide layer 24B which has been planarized, Steps 144 to 147 of patterning the plurality of SRRs 16 in the second metallic thin film 26B, and Step 148 of forming the silicon dioxide layer 24C so as to cover the plurality of SRRs 16 which have been patterned.

By repeating the operations of Steps 143 to 148 as described above, it is possible to produce the resonating elements 14D including a large number of the SRRs 16 arranged in multiple layers.

Note that following modifications can be made to the respective embodiments described above.

(1) First, it is allowable to apply (coat) a surfactant to surfaces of the protective layers 18, 18A of the respective resonating elements 14, 14A to 14D of the respective embodiments. By doing so, it is possible to prevent the plurality of resonating elements 14, 14A to 14D from fixing to one another when the resonating elements 14, 14A to 14D are in the powdery state.

(2) Next, instead of the first photoresist layer 22A on the wafer P in FIG. 5(A) of the first embodiment or the first photoresist layer 22A on the wafer P in FIG. 15(A) of the second embodiment, it is allowable to form, for example, a layer of silicon dioxide as the sacrifice layer. In such a case, it is possible to use, for example, fluorinated acid as a dissolving liquid for dissolving the sacrifice layer in Step 112 or Step 154. Namely, the wafer P may be immersed in the fluorinated acid. As the material for forming the protective layer 18, 18A in this case (material used instead of the material forming the silicon dioxide layers 24A to 24C), it is allowable to use a material which is not dissolved by the fluorinated acid, such as silicon nitride, aluminum oxide or aluminum nitride (AlN), etc.

(3) Further, instead of using the SRRs 16 inside the resonating elements 14C, 14D of the second embodiment, it is allowable to use the double split-ring resonator 17 shown in FIG. 7(B), in a similar manner as in the first embodiment. A resonating element in which a plurality of double split-ring resonators 17 are covered by the protective film 18A, etc., can also be easily produced by a producing method similar to the producing method of FIG. 13. Accordingly, the construction of the split-ring resonator is arbitrary.

(4) Furthermore, in the second embodiment, in a case that the exposure is performed with the image of the pattern of the first reticle R4 shown in FIG. 14(B) in Step 145 of FIG. 13 by using, for example, a dry-type exposure apparatus of which resolution is lower than that of the liquid-immersion type exposure apparatus 50, there is a fear that the resolution might not be sufficient. In such a case, it is allowable to divide the large number of ring-shaped patterns 55 of the reticle R4 into two simpler-shaped patterns and to perform double-exposure with these two divided patterns, in a similar manner to the first embodiment. By doing so, it is possible to produce the large number of resonating elements 14C, 14D including the minute SRRs 16 highly precisely by using an exposure apparatus having a low resolution.

Note that it is allowable to divide the large number of ring-shaped patterns 55 of the reticle R4 into two or more pieces of simpler-shaped patterns and to perform multiple-exposure with these two or more divided patterns.

(5) Moreover, in the first embodiment, in a case that a large number of the resonating elements 14, 14A, 14B are mixed in the solvent 30a to thereby produce the liquid 30 as shown in FIG. 6(B) or in the second embodiment, in a case that a large number of the resonating elements 14C, 14D, etc. are mixed in the solvent 30a to thereby produce the liquid 30, it is allowable to use, as the solvent 30a, for example a solvent obtained by mixing a coloring matter which absorbs the illumination light in pure water (purified water) so that the real part of the permittivity of the solvent 30a to the illumination light is made to be negative. Since the coloring matter functions as a substance having a negative permittivity, the refractive index of the liquid 30 to the illumination light is negative when the real part of the relative permeability of the resonating elements 14, 14A to 14D, etc. to the illumination light is negative.

(6) Further, in a case that the liquid 30 is produced by mixing the large number of resonating elements 14, 14A to 14D, etc. in the solvent 30a, the refractive index of the solvent 30a may be made to be similar to the refractive index of the protective layers 18, 18A of the resonating elements 14, 14A to 14D. In a case that the protective layers 18, 18A is formed of silicon dioxide, it is allowable to use, for example, a hydrocarbon-based liquid (high-refractive index liquid) such as decalin or dicyclohexyl, etc. as a solvent having the refractive index similar to that of silicon dioxide. By doing so, the difference between the refractive index of the solvent 30a and the refractive index of the protective layers 18, 18A is made to be small, which in turn reduces the light loss (optical loss) due to the reflection of the illumination light at the interface between the solvent 30a and the protective layers 18, 18A.

(7) Furthermore, in a case that the optical element 32 is produced by mixing the large number of resonating elements 14, 14A and 14B with the medium 32a (filling agent) of FIG. 6(D) and by solidifying the mixture of the large number of resonating elements 14, 14A, 14B and the medium 32a in the first embodiment, or in a case that the optical element 32 is produced by mixing the large number of resonating elements 14C, 14D with the medium 32a (filling agent) and by solidifying the mixture of the large number of resonating elements 14C, 14D and the medium 32a in the second embodiment, it is allowable to use, as the medium 32a, a thermo-curable resin such as silicon resin. In this case, by performing a step of mixing the thermo-curable resin in liquid form and a large number of the resonating elements 14, 14A to 14D followed by being uniformly agitated and a step of heating the mixture to solidify the thermo-curable resin, it is possible to easily produce an optical element 32 in which the large number of resonating elements 14, 14A to 14D and the solid medium 32a are uniformly mixed.

(8) Moreover, in the second embodiment, it is allowable to use, as the medium 32a which is to be mixed with a large number of the resonating elements 14C (or 14D), a solid obtained by solidifying a liquid in the sol state by the Sol-Gel process, similarly in the first embodiment.

(9) Further, in the resonating elements 14C, 14D of the second embodiment, the real part of the permittivity is positive and the real part of the relative permittivity is also positive (for example, real number greater than 1). Therefore, even when a large number of the resonating elements 14C, 14D are merely collected, the refractive index remains to be positive.

Figure 17A:
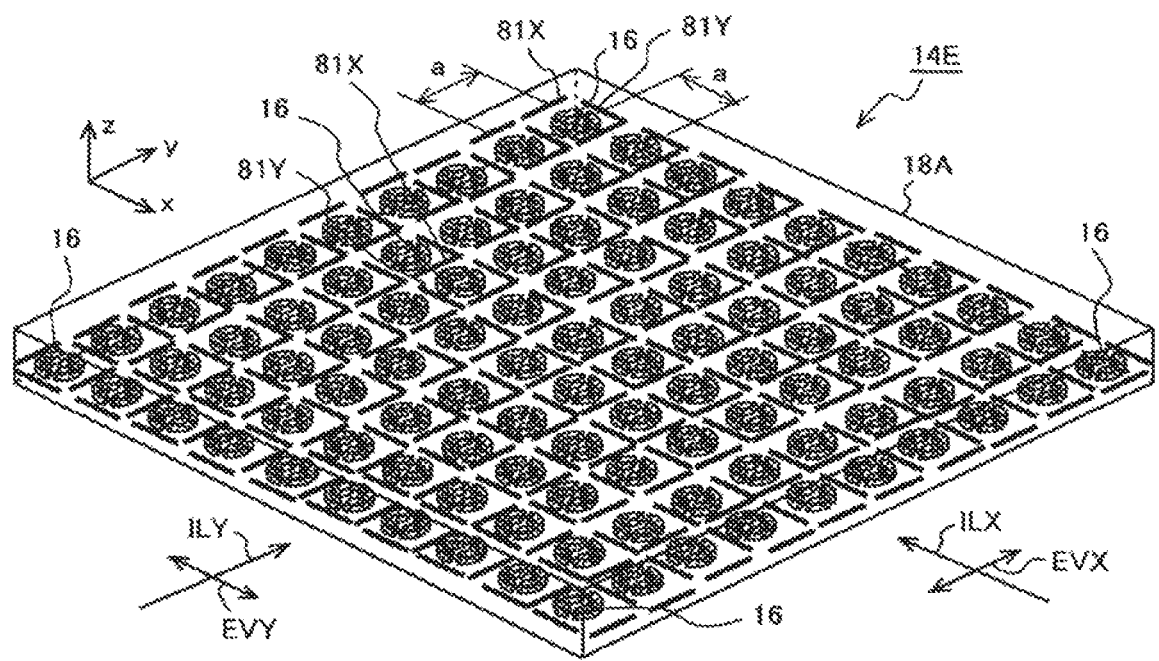
FIG. 17(A) is an enlarged perspective view of a resonating element 14E of a modification.

In view of this, similarly as in the first embodiment, as a resonating element 14E of a modification shown in FIG. 17(A), it is allowable to form line patterns 81X elongated in the y-direction and line patterns 81Y elongated in the x direction so as to sandwich (interpose), in the y-direction and the x-direction, each of a large number of SRRs (split-ring resonators) 16, which are arranged inside the protective layer 18A along the x-axis and y-axis at the period "a", therebetween. The line patterns 81X, 81Y are minute thin lines formed of a conductor (metal, etc.) which is same as that forming the SRR 16.

In this modification, it is assumed that the wavelength of the light ILY is within a range in which the real part μRe of the relative permeability of the light ILY of FIG. 2 takes a negative value (for example, a value slightly smaller than the wavelength λ3) provided that the light ILY is a light in which the vibration direction EVY of the electric field vector is parallel to the x-axis (linearly polarized in the x-direction) and the vibration direction of the magnetic field vector is parallel to the z-axis and that the light ILY comes into the resonating element 14E in the y-direction. In this case, the line width (cross-sectional area) and the length in the x-direction of the line pattern 81Y and the arrangement such as the x-direction and y-direction period, etc. of the large number of line patterns 81Y are set so that the real part of the permittivity of the resonating elements 14E to the light ILY is negative (the real part of the relative permittivity is also negative).

As a result, the resonating element 14E (or a substance obtained by stacking the resonating elements 14E in the z-direction) becomes a meta-material in which the refractive index to the light ILY takes a negative value. Note that the example of construction of the plurality of thin metallic lines having a negative real part of the permittivity with respect to the microwave is disclosed in Reference Literature B as described above. The line patterns 81Y of the modification shown in FIG. 17(A) is formed to have the minute shape and arrangement so that the real part of the permittivity to the visible light takes a negative value.

Further, it is presumed that the shape and arrangement of the large number of line patterns 81X elongated in the y-direction inside the resonating element 14E are same as the shape and arrangement of the line patterns 81Y. In this case, when a light ILX (presumed as having a same wavelength as that of the light ILY) in which the vibration direction EVX of the electric field vector is parallel to the y-axis (linearly polarized in the y-direction) and the vibration direction of the magnetic field vector is parallel to the z-axis comes into the resonating element 14E in the x-direction, the real part of the permittivity of the resonating element 14E to the light ILX also becomes negative, due to the line pattern 81X. Accordingly, the refractive index of the resonating element 14E to the light ILX also takes a negative value. Therefore, by mixing the large number of resonating elements 14E in the liquid or by solidifying the large number of resonating elements 14E to thereby form an optical element, it is possible to produce an optical liquid or optical element having a negative refractive index to a light having a predetermined wavelength.

Also in the resonating element 14D of FIG. 11(A), it is possible to make the real part of the permittivity of the resonating element 14D to the light having the predetermined wavelength take a negative value by arranging a plurality of the line patterns formed of conductor in the vicinity of the respective SRRs 16. As a result, the refractive index of the resonating element 14D to the light having the predetermined wavelength becomes negative.

Figure 17B:
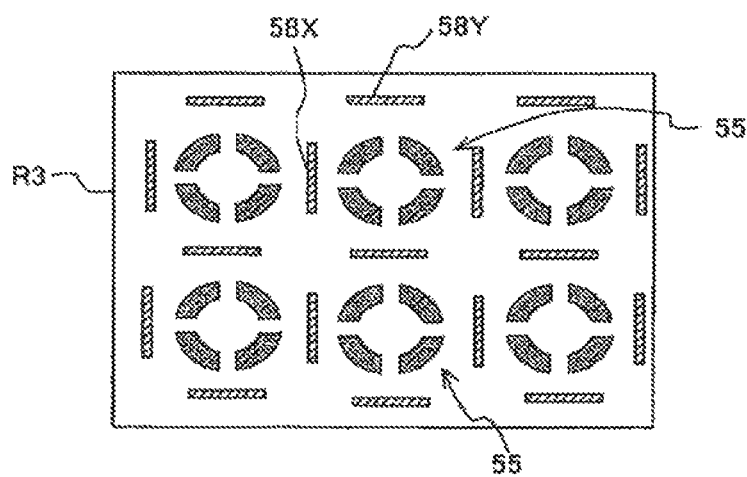
FIG. 17(B) is an enlarged plan view of a part of a pattern of a reticle for producing the resonating element 14E.

Next, in a case that the resonating element 14E of FIG. 17(A) is produced, it is allowable to use, in Step 145 of FIG. 13, a reticle R3 in which line patterns 58X, 58Y formed of a light-shielding film and corresponding to the line patterns 81X, 81Y are formed around each of the ring-shaped patterns 55 as shown in FIG. 17(B), instead of using the reticle R4 of FIG. 14(B).

By doing so, the line patterns 81X, 81Y can be patterned together with the large number of SRRs 16 in the metallic thin film 26A, 26B, etc.

Note that the present teaching is not limited to the above-described embodiments, and may take a various kinds of construction or configuration within a scope without deviating from the gist or essential characteristics of the present teaching. Further, the contents including the specification, the claims, the drawings and the abstract of each of U.S. Provisional Application Ser. No. 61/202,845 filed on Apr. 10, 2009, Japanese Patent Application No. 2009-243438 filed on Oct. 22, 2009 and Japanese Patent Application No. 2009-243439 filed on Oct. 22, 2009 are incorporated herein by reference in their entireties.

It is theoretically possible to realize a substance having the relative permeability greatly different from 1 to the lights in the infrared to visible regions and further to realize a substance having the relative permeability with a negative value to the lights in the infrared to visible regions by using the conventional minute split-ring resonators. However, in order to apply the substance, for example, to a visible light, the split-ring resonators are formed to have a radius of about not more than 100 nm, and there arises a problem of how to produce the respective split-ring resonators highly precisely and in a large quantity. Further, when simply producing a large number of split-ring resonators, there is a fear that these split-ring resonators might be brought into contact with one another, and further that the structure of the split-ring resonators might be destroyed or damaged, thereby making it impossible to exhibit a desired relative permeability characteristic with respect to a light as the application objective of the split-ring resonators.

Further, when merely producing the minute split-ring resonators by using the lithography technique, the respective resonators are formed while being aligned or arranged in a two-dimensional plane, which in turn causes a problem such that the obtained resonators as they are cannot be used as an optical material having a three-dimensional volume. Furthermore, even if two-dimensional planes, in each of which a large number of split-ring resonators are arranged, are stacked so that the stacked two-dimensional planes have a three-dimensional volume, the respective resonators are aligned in one and same direction (orientation), which in turn causes a problem such that the obtained material is anisotropic as an optical material and thus is not a isotropic optical material.

The present invention has been made in view of the above-described situation, and has an object to provide an optical material (a kind of meta-material) which is for example capable of having a relative permeability different from 1 to a light having a wavelength in the infrared region or shorter than the infrared region and which has a stable structure, and to provide a liquid and solid (optical element) using the optical material.

Another object of the present invention is to provide a method capable of mass-producing such an optical material with high precision, and a method for producing the liquid and solid using the optical material.

According to the optical material of the present invention, the minute resonators are formed to have a size or dimension which is, for example, about not more than the wavelength of visible light, thereby making it possible to realize the relative permeability which is different from 1 to a light in the infrared region or a light having a wavelength shorter than the infrared region. Further, since each of the minute resonators is covered by the protective film, the plurality of minute resonators do not make contact with each other, thereby realizing the stable structure.

According to the method for producing the optical material of the fifth or sixth aspect of the present invention, it is possible to mass-produce the optical material of the first or second aspect of the present invention with high precision, by using, for example, the photolithography process.

The invention claimed is:

1. An optical member to be arranged in an optical path of a light, the optical member comprising:
   an optical medium made of an insulator or a semiconductor;
   a first element provided at a first position in the optical medium and made of a first electric conductor having a width approximately same as or smaller than a wavelength of the light, the first position being a position in the optical path; and
   a second element provided at a second position, in the optical medium, different from the first position, and made of a second electric conductor having a width approximately same as or smaller than the wavelength of the light, the second position being a position in the optical path.

2. The optical member according to claim 1, wherein the first element and the second element constitute a resonator.

3. The optical member according to claim 2, wherein the first element and the second element have a form of a partial annular shape.

4. The optical member according to claim 2, wherein a real part of a permeability, of the resonator, to the light is negative.

5. The optical member according to claim 4, wherein a real part of a permittivity, of the optical medium, to the light is negative.

6. The optical member according to claim 2, wherein a real part of a permittivity, of the optical medium, to the light is negative.

7. The optical member according to claim 1, wherein the first element and the second element have a form of a partial annular shape.

8. The optical member according to claim 1, wherein the optical medium is configured to prevent the first and second elements from contacting each other.

9. The optical member according to claim 1, wherein an electric conductivity of the optical medium is different from an electric conductivity of the first electric conductor and an electric conductivity of the second electric conductor.

10. The optical member according to claim 1, wherein the optical medium is made of the silicon dioxide.

11. The optical member according to claim 1, wherein the optical medium is made of the semiconductor.

12. The optical member according to claim 1, wherein the optical member has a form of a powder.

13. An optical liquid comprising the optical member as defined in claim 12 mixed in the optical liquid.

14. An optical element comprising:
   one or more first optical member each of which is the optical member as defined in claim 1; and
   a second optical member made of a material different from a material of the optical medium.

15. The optical element according to claim 14, wherein the second optical member is in contact with the first optical member.

16. The optical element according to claim 15, wherein the optical element includes a plurality of first optical elements, and the second optical member is positioned between the plurality of first optical elements.

17. The optical member according to claim 1, wherein the optical medium is a solid.

\* \* \* \* \*